(12) United States Patent
Feiring et al.

(10) Patent No.: US 6,790,587 B1
(45) Date of Patent: Sep. 14, 2004

(54) FLUORINATED POLYMERS, PHOTORESISTS AND PROCESSES FOR MICROLITHOGRAPHY

(75) Inventors: Andrew Edward Feiring, Wilmington, DE (US); Jerald Feldman, Hockessin, DE (US); Frank Leonard Schadt, III, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/959,077

(22) PCT Filed: Apr. 28, 2000

(86) PCT No.: PCT/US00/11539

§ 371 (c)(1),
(2), (4) Date: Oct. 17, 2001

(87) PCT Pub. No.: WO00/67072

PCT Pub. Date: Nov. 9, 2000

Related U.S. Application Data

(60) Provisional application No. 60/132,373, filed on May 4, 1999.

(51) Int. Cl.[7] .......................... G03F 7/004; C08F 36/00
(52) U.S. Cl. .................... 430/270.1; 430/325; 430/326; 430/907; 526/242; 526/247; 526/281
(58) Field of Search ....................... 526/242; 430/270.1, 430/326, 907, 325, 281, 242, 249

(56) References Cited

U.S. PATENT DOCUMENTS

| | | | |
|---|---|---|---|
| 3,444,148 A | | 5/1969 | Adelman |
| 4,963,471 A | | 10/1990 | Trout et al. |
| 5,177,166 A | | 1/1993 | Kobo et al. |
| 5,229,473 A | | 7/1993 | Kobo et al. |
| 5,655,627 A | | 8/1997 | Horne et al. |
| 6,468,712 B1 | * | 10/2002 | Fedynyshyn |
| 6,503,686 B1 | * | 1/2003 | Fryd et al. ............... 430/270.1 |
| 2002/0009668 A1 | | 1/2002 | Nishimura et al. |

FOREIGN PATENT DOCUMENTS

| | | |
|---|---|---|
| DE | 4207261 | 9/1993 |
| DE | 4207264 | 9/1993 |
| EP | 0789278 | 8/1997 |
| JP | 62186907 | 8/1987 |
| JP | 03281664 | 12/1991 |
| WO | WO 9733198 | 9/1993 |
| WO | WO 0017712 | 3/2000 |

OTHER PUBLICATIONS

Macromolecules, F. M. Houlihan et al., 30, p. 6517–6534 (1997).
Journal of Photopolymer Science and Technology, F. M. Houlihan et al., 10, No. 3, p. 511–520 (1997).
J. Niu and J. Frechet, Angew. Chem. Int. Ed., 37, No. 5 (1998), pp. 667–670.
H. Ito et al, Synthesis and Evaluation of Alicyclic Backbone Polymers for 193 nm Lithography, Chapter 16, ACS Symposium Series 706 (Micro– and Nanopatterning Polymers) pp. 208–223 (1998).
H. Ito et al., Abstract in Polymerica Materials Science and Engineering Division, American Chemcial Society Meeting, vol. 77; Fall Meeting, Sep. 8–11, 1997, held in Las Vegas, NV.
K. J. Przybilla et al, Hexafluoroacetone in Resist Chemistry, A Versatile New Concept for Materials for Deep UV Lithography, SPIE vol., 1672, (1992), pp. 500–512.
T. Wallow et al., SPIE, vol. 2724, pp. 355–364.
Introduction to Microlithography, Second Edition by L.F. Thompson, C.G. Willson, and M.J. Bowden, American Chemical Society, Washington, DC 1194.
U. Okoroanyanwa et al., SPIE, vol. 3049, pp. 92–103.
R. Allen et al., SPIE, vol. 2724, pp. 334–343.
Semiconductor International, Sep. 1997, pp. 74–80.

* cited by examiner

*Primary Examiner*—Rosemary Ashton

(57) ABSTRACT

Fluorinated polymers, photoresists and associated processes for microlithography are described. These polymers and photoresists are comprised of a fluoroalcohol functional group which simultaneously imparts high ultraviolet (UV) transparency and developability in basic media to these materials. The materials of this invention have high UV transparecy, particularly at short wavelengths, e.g., 157 nm, which makes them highly useful for lithography at these short wavelengths.

66 Claims, No Drawings

FLUORINATED POLYMERS, PHOTORESISTS AND PROCESSES FOR MICROLITHOGRAPHY

This application claims the benefit of Provisional application No. 60/132,373, filed May 4, 1999.

BACKGROUND OF THE INVENTION

1. Field of the Invention

The present invention pertains to photoimaging and, in particular, the use of photoresists (positive-working and/or negative-working) for imaging in the production of semiconductor devices. The present invention also pertains to novel fluorine-containing polymer compositions having high UV transparency (particularly at short wavelengths, e.g., 157 nm) which are useful as base resins in resists and potentially in many other applications.

2. Description of Related Art

Polymer products are used as components of imaging and photosensitive systems and particularly in photoimaging systems such as those described in *Introduction to Microlithography, Second Edition* by L. F. Thompson, C. G. Willson, and M. J. Bowden, American Chemical Society, Washington, D.C., 1994. In such systems, ultraviolet (UV) light or other electromagnetic radiation impinges on a material containing a photoactive component to induce a physical or chemical change in that material. A useful or latent image is thereby produced which can be processed into a useful image for semiconductor device fabrication.

Although the polymer product itself may be photoactive, generally a photosensitive composition contains one or more photoactive components in addition to the polymer product. Upon exposure to electromagnetic radiation (e.g., UV light), the photoactive component acts to change the rheological state, solubility, surface characteristics, refractive index, color, electromagnetic characteristics or other such physical or chemical characteristics of the photosensitive composition as described in the Thompson et al. publication supra.

For imaging very fine features at the submicron level in semiconductor devices, electromagnetic radiation in the far or extreme ultraviolet (UV) is needed. Positive working resists generally are utilized for semiconductor manufacture. Lithography in the UV at 365 nm (I-line) using novolak polymers and diazonaphthoquinones as dissolution inhibitors is a currently established chip technology having a resolution limit of about 0.35–0.30 micron. Lithography in the far UV at 248 nm using p-hydroxystyrene polymers is known and has a resolution limit of 0.35–0.18 nm. There is strong impetus for future photolithography at even shorter wavelengths, due to a decreasing lower resolution limit with decreasing wavelength (i.e., a resolution limit of 0.18–0.12 micron for 193 nm imaging and a resolution limit of about 0.07 micron for 157 nm imaging). Photolithography using 193 nm exposure wavelength (obtained from an argon fluorine (ArF) excimer laser) is a leading candidate for future microelectronics fabrication using 0.18 and 0.13 μm design rules. Photolithography using 157 nm exposure wavelength (obtained from a fluorine excimer laser) is a leading candidate for future microlithography further out on the time horizon (beyond 193 nm) provided suitable materials can be found having sufficient transparency and other required properties at this very short wavelength. The opacity of traditional near UV and far UV organic photoresists at 193 nm or shorter wavelengths precludes their use in single-layer schemes at these short wavelengths.

Some resist compositions suitable for imaging at 193 nm are known. For example, photoresist compositions comprising cycloolefin-maleic anhydride alternating copolymers have been shown to be useful for imaging of semiconductors at 193 nm (see F. M. Houlihan et al, *Macromolecules*, 30, pages 6517–6534 (1997); T. Wallow et al., SPIE, Vol. 2724, pages 355–364; and F. M. Houlihan et al., *Journal of Photopolymer Science and Technology*, 10, No. 3, pages 511–520 (1997)). Several publications are focused on 193 nm resists (i.e., U. Okoroanyanwu et al, SPIE, Vol. 3049, pages 92–103; R. Allen et al., SPIE, Vol. 2724, pages 334–343; and Semiconductor International, September 1997, pages 74–80). Compositions comprising addition polymers and/or ROMP (ring-opening methathesis polymerization) of functionalized norborenes have been disclosed (e.g., PCT WO 97/33198 (Sep. 12, 1997) to B. F. Goodrich). Homopolymers and maleic anhydride copolymers of norbornadiene and their use in 193 nm lithography have been disclosed (J. Niu and J. Frechet, Angew. Chem. Int. Ed., 37, No. 5, (1998), pages 667–670). Copolymers of flourinated alcohol-substituted polycyclic etylenically unsaturated comonomer and sulfur dioxide that are suitable for 193 nm lithography have been reported (see H. Ito et al., "Synthesis and Evaluation of Alicyclic Backbone Polymers for 193 nm lithography", Chapter 16, ACS Symposium Series 706 (Micro- and Nanopatterning Polymers) pages 208–223 (1998), and H. Ito et al., Abstract in Polymeric Materials Science and Engineering Division, American Chemical Society Meeting, Volume 77, Fall Meeting, Sep. 8–11, 1997, held in Las Vegas, Nev.) Because of the presence of repeat units derived from sulfur dioxide in this alternating copolymer, it is not suitable for 157 nm lithography due to the excessively high absorption coefficient of this polymer at 157 nm.

Photoresists containing fluorinated alcohol functional groups attached to aromatic moieties have been disclosed (see K. J. Przybilla et al., "Hexafluoroacetone in Resist Chemistry: A Versatile New Concept for Materials for Deep UV Lithography", SPIE Vol. 1672, (1992), pages 500–512). While suitable for 248 nm lithography, these resists, because of the aromatic functionality contained in them, are unsuitable for lithography at 193 or 157 nm (due to the excessively high absorption coefficients of the aromatic resist components at these wavelengths).

Resist compositions suitable for imaging at 157 nm are presently unknown. The main reason for this current status of 157 nm resists is that most or all known materials absorb to a significant degree at this wavelength to preclude their use as component(s) in 157 nm resists.

Copolymers of fluoroolefin monomers and cyclic unsaturated monomers are known (U.S. Pat. Nos. 5,177,166 and 5,229,473 to Daikin Industries, Ltd.). These patents do not disclose the use of these copolymers in any photosensitive compositions. Copolymers of certain fluorinated olefins with certain vinyl esters are known. For example, the copolymer of TFE with cyclohexanecarboxylate, vinyl ester is known (Japanese Patent Appl. JP 03281664 to Dainippon Ink and Chemicals). Copolymers of TFE and vinyl esters, such as vinyl acetate, and use of these copolymers in photosensitive compositions for refractive index imaging (e.g., holography) is known (U.S. Pat. No. 4,963,471 to DuPont).

Certain copolymers of fluorinated alcohol comonomers with other comonomers have been reported in U.S. Pat. No. 3,444,148 and JP 62186907 A2 patent publication. These patents are directed to membrane or other non-photosensitve films or fibers, and neither has any teaching of fluorinated alcohol comonomers use in photosensitve layers (e.g., resists).

U.S. Pat. No. 5,655,627 discloses a process for generating a negative tone resist image by coating a silicon wafer with a copolymer resist solution of pentafluoropropyl methacrylate-t-butyl methacrylate in a solvent, and then exposing at 193 nm and developing with a carbon dioxide critical fluid.

There is a critical need though for other novel resist compositions for use at 193 nm, and particularly at 157 nm, or lower that have not only high transparency at these short wavelengths but also suitable other key properties, including good plasma etch resistance and adhesive properties.

SUMMARY OF THE INVENTION

The invention in some embodiments comprises a photoresist comprising:

(a) a fluorine-containing polymer comprising a repeat unit derived from at least one ethylenically unsaturated compound containing a fluoroalcohol functional group having the structure:

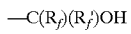

—C(R$_f$)(R$_f'$)OH wherein R$_f$ and R$_f'$ are the same or different fluoroalkyl groups of from 1 to about 10 carbon atoms or taken together are (CF$_2$)$_n$ wherein n is 2 to 10; and (b) at least one photoactive component;

wherein the fluorine-containing polymer has an absorption coefficient of less than 4.0 $\mu$m$^{-1}$ at a wavelength of 157 nm.

The invention is also a process for preparing a photoresist image on a substrate comprising, in order:

(W) applying a photoresist composition on a substrate, wherein the photoresist composition comprises:
(a) a fluorine-containing polymer comprising a repeat unit derived from at least one ethylenically unsaturated compound containing a fluoroalcohol functional group having the structure:

—C(R$_f$)(R$_f'$)OH wherein R$_f$ and R$_f'$ are the same or different fluoroalkyl groups of from 1 to about 10 carbon atoms or taken together are (CF$_2$)$_n$ wherein n is 2 to 10, and wherein the fluorine-containing polymer has an absorption coefficient of less than 4.0 $\mu$m$^{-1}$ at a wavelength of 157 nm;
(b) at least one photoactive component; and
(c) a solvent;

(X) drying the photoresist composition to substantially remove the solvent and thereby form a photoresist layer on the substrate;

(Y) imagewise exposing the photoresist layer to form imaged and non-imaged areas; and (Z) developing the exposed photoresist layer having imaged and non-imaged areas to form the relief image on the substrate.

In another embodiment, the invention is a fluorine-containing copolymer comprising a repeat unit derived from at least one ethylenically unsaturated compound characterized in that at least one ethylenically unsaturated compound is cyclic or polycyclic, at least one ethylenically unsaturated compound contains at least one fluorine atom covalently attached to an ethylenically unsaturated carbon atom, and at least one ethylenically unsaturated compound is comprised of a fluoroalcohol functional group having the structure:

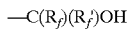

—C(R$_f$)(R$_f'$)OH wherein R$_f$ and R$_f'$ are the same or different fluoroalkyl groups of from 1 to about 10 carbon atoms or taken together are (CF$_2$)n wherein n is 2 to 10.

In another embodiment, the invention is a photoresist comprising:

(a) a fluorine-containing copolymer comprising a repeat unit derived from at least one ethylenically unsaturated compound characterized in that at least one ethylenically unsaturated compound is cyclic or polycyclic, at least one ethylenically unsaturated compound contains at least one fluorine atom covalently attached to an ethylenically unsaturated carbon atom, and at least one ethylenically unsaturated compound is comprised of a fluoroalcohol functional group having the structure:

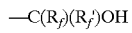

—C(R$_f$)(R$_f'$)OH wherein R$_f$ and R$_f'$ are the same or different fluoroalkyl groups of from 1 to about 10 carbon atoms or taken together are (CF$_2$)$_n$ wherein n is 2 to 10; and (b) at least one photoactive component;

wherein the fluorine-containing copolymer contains sufficient functionality to render the photoresist developable so as to produce a relief image upon imagewise exposure to ultraviolet radiation having wavelength of <365 nm.

In another embodiment, the invention is a process for preparing a photoresist image on a substrate comprising, in order:

(W) applying a photoresist composition on a substrate, wherein the photoresist composition comprises:
(a) a fluorine-containing copolymer comprising a repeat unit derived from at least one ethylenically unsaturated compound characterized in that at least one ethylenically unsaturated compound is cyclic or polycyclic, at least one ethylenically unsaturated compound contains at least one fluorine atom covalently attached to an ethylenically unsaturated carbon atom, and at least one ethylenically unsaturated compound is comprised of a fluoroalcohol functional group having the structure:

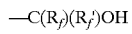

—C(R$_f$)(R$_f'$)OH wherein R$_f$ and R$_f'$ are the same or different fluoroalkyl groups of from 1 to about 10 carbon atoms or taken together are (CF$_2$)$_n$ wherein n is 2 to 10;
(b) at least one photoactive component; and
(c) a solvent;
wherein the fluorine-containing copolymer contains sufficient functionality to render the photoresist developable so as to produce a relief image upon imagewise exposure to ultraviolet radiation having wavelength of <365 nm;

(X) drying the photoresist composition to substantially remove the solvent and thereby form a photoresist layer on the substrate;

(Y) imagewise exposing the photoresist layer to form imaged and non-imaged areas; and (Z) developing the exposed photoresist layer having imaged and non-imaged areas to form the relief image on the substrate.

In another embodiment, the invention is a photoresist comprising:

(a) a fluorine-containing copolymer comprising:
(i) a repeat unit derived from at least one ethylenically unsaturated compound containing at least three fluorine atoms covalently attached to two ethylenically unsaturated carbon atoms; and

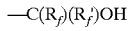

(ii) a repeat unit derived from an ethylenically unsaturated compound comprised of a fluoroalcohol functional group having the structure:

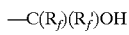
—C(R$_f$)(R$_f'$)OH wherein R$_f$ and R$_f'$ are the same or different fluoroalkyl groups of from 1 to about 10 carbon atoms or taken together are (CF$_2$)$_n$ wherein n is 2 to 10; and (b) at least one photoactive component;

wherein the fluorine-containing copolymer contains sufficient functionality to render the photoresist developable so as to produce a relief image upon imagewise exposure to ultraviolet radiation having wavelength of <365 nm.

In another embodiment, the invention is a process for preparing a photoresist image on a substrate comprising, in order:

(W) applying a photoresist composition on a substrate, wherein the photoresist composition comprises:
(a) a fluorine-containing copolymer comprising:
(i) a repeat unit derived from at least one ethylenically unsaturated compound containing at least three fluorine atoms covalently attached to two ethylenically unsaturated carbon atoms that makeup a carbon-carbon double bond; and
(ii) a repeat unit derived from an ethylenically unsaturated compound comprised of a fluoroalcohol functional group having the structure:

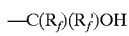
—C(R$_f$)(R$_f'$)OH wherein R$_f$ and R$_f'$ are the same or different fluoroalkyl groups of from 1 to about 10 carbon atoms or taken together are (CF$_2$)$_n$ wherein n is 2 to 10;
(b) at least one photoactive component; and
(c) a solvent;

wherein the fluorine-containing copolymer contains sufficient functionality to render the photoresist developable so as to produce a relief image upon imagewise exposure to ultraviolet radiation having wavelength of <365 nm;

(X) drying the photoresist composition to substantially remove the solvent and thereby form a photoresist layer on the substrate;
(Y) imagewise exposing the photoresist layer to form imaged and non-imaged areas; and
(Z) developing the exposed photoresist layer having imaged and non-imaged areas to form the relief image on the substrate.

In yet another embodiment, the invention is a photoresist comprising:

(a) a fluorine-containing copolymer comprising a repeat unit derived from at least one ethylenically unsaturated compound containing a fluoroalcohol functional group having the structure:

—XCH$_2$C(R$_f$)(R$_f'$)OH wherein R$_f$ and R$_f'$ are the same or different fluoroalkyl groups of from 1 to about 10 carbon atoms or taken together are (CF$_2$)$_n$ wherein n is 2 to 10; and X is selected from the group consisting of sulfur, oxygen, nitrogen, phosphorous, other Group Va element, and other Group VIa element; and (b) at least one photoactive component;

wherein the fluorine-containing copolymer contains sufficient functionality to render the photoresist developable so as to produce a relief image upon imagewise exposure to ultraviolet radiation having wavelength of <365 nm.

In another embodiment, the invention is a process for preparing a photoresist image on a substrate comprising, in order:

(W) applying a photoresist composition on a substrate, wherein the photoresist composition comprises:
(a) a fluorine-containing copolymer comprising a repeat unit derived from at least one ethylenically unsaturated compound containing a fluoroalcohol functional group having the structure:

—XCH$_2$C(R$_f$)(R$_f'$)OH wherein R$_f$ and R$_f'$ are the same or different fluoroalkyl groups of from 1 to about 10 carbon atoms or taken together are (CF$_2$)$_n$ wherein n is 2 to 10; X is selected from the group consisting of sulfur, oxygen, nitrogen, phosphorous, other Group Va element, and other Group VIa element; and wherein the fluorine-containing copolymer contains sufficient functionality to render the photoresist developable so as to produce a relief image upon imagewise exposure to ultraviolet radiation having wavelength of <365 nm;
(b) at least one photoactive component; and
(c) a solvent;

(X) drying the photoresist composition to substantially remove the solvent and thereby form a photoresist layer on the substrate;
(Y) imagewise exposing the photoresist layer to form imaged and non-imaged areas; and
(Z) developing the exposed photoresist layer having imaged and non-imaged areas to form the relief image on the substrate.

In still another embodiment, the invention is a fluorine-containing polymer comprising the structure:

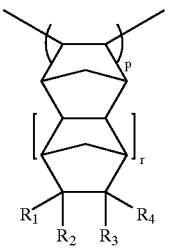

wherein each of R$_1$, R$_2$, R$_3$, and R$_4$ independently is hydrogen, a halogen atom, a hydrocarbon group containing from 1 to 10 carbon atoms, a substituted hydrocarbon group, an alkoxy group, a carboxylic acid, a carboxylic ester or a functional group containing the structure:

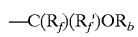
—C(R$_f$)(R$_f'$)OR$_b$ wherein R$_f$ and R$_f'$ are the same or different fluoroalkyl groups of from 1 to 10 carbon atoms or taken together are (CF$_2$)$_n$ wherein n is 2 to 10; R$_b$ is hydrogen or an acid- or base-labile protecting group; p is the number of repeat units in the polymer; r is 0–4; at least one of the repeat units has a structure whereby at least one of R$_1$, R$_2$, R$_3$, and R$_4$ contains the structure C(R$_f$)(R$_f'$)OR$_b$; and wherein the fluorine-containing polymer has an absorption coefficient of less than 4.0 $\mu m^{-1}$ at a wavelength of 157 nm.

In another embodiment, the invention is a photoresist comprising:

(a) a fluorine-containing polymer comprising the structure:

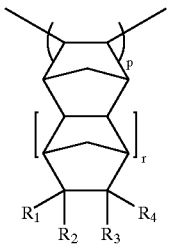

wherein each of $R_1$, $R_2$, $R_3$, and $R_4$ independently is hydrogen, a halogen atom, a hydrocarbon group containing from 1 to 10 carbon atoms, a substituted hydrocarbon group, an alkoxy group, a carboxylic acid, a carboxylic acid ester or a functional group containing the structure:

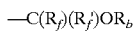

—C($R_f$)($R_f'$)O$R_b$ wherein $R_f$ and $R_f'$ are the same or different fluoroalkyl groups of from 1 to 10 carbon atoms or taken together are $(CF_2)_n$ wherein n is 2 to 10; $R_b$ is hydrogen or an acid- or base-labile protecting group; p is the number of repeat units in the polymer; r is 0–4; at least one of the repeat units has a structure whereby at least one of $R_1$, $R_2$, $R_3$, and $R_4$ contains the structure C($R_f$)($R_f'$)O$R_b$; and wherein the fluorine-containing polymer has an absorption coefficient of less than 4.0 $\mu m^{-1}$ at a wavelength of 157 nm; and (b) at least one photoactive component.

In another embodiment, the invention is a process for preparing a photoresist image on a substrate comprising, in order:

(W) applying a photoresist composition on a substrate, wherein the photoresist composition comprises:
(a) a fluorine-containing polymer comprising the structure:

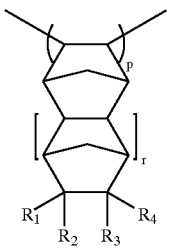

wherein each of $R_1$, $R_2$, $R_3$, and $R_4$ independently is hydrogen, a halogen atom, a hydrocarbon group containing from 1 to 10 carbon atoms, a substituted hydrocarbon group, an alkoxy group, a carboxylic acid, a carboxylic acid ester, or a functional group containing the structure:

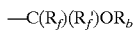

—C($R_f$)($R_f'$)O$R_b$ wherein $R_f$ and $R_f'$ are the same or different fluoroalkyl groups of from 1 to 10 carbon atoms or taken together are $(CF_2)_n$ wherein n is 2 to 10; $R_b$ is hydrogen or an acid- or base-labile protecting group; p is the number of repeat units in the polymer; r is 0–4; at least one of the repeat units has a structure whereby at least one of $R_1$, $R_2$, $R_3$, and $R_4$ contains the structure C($R_f$)($R_f'$)O$R_b$; and wherein the fluorine-containing polymer has an absorption coefficient of less than 4.0 $\mu m^{-1}$ at a wavelength of 157 nm;

(b) at least one photoactive component; and
(c) a solvent;

(X) drying the photoresist composition to substantially remove the solvent and thereby form a photoresist layer on the substrate;

(Y) imagewise exposing the photoresist layer to form imaged and non-imaged areas; and (Z) developing the exposed photoresist layer having imaged and non-imaged areas to form the relief image on the substrate.

DETAILED DESCRIPTION OF THE PREFERRED EMBODIMENT(S)

Fluorinated Alcohol (Co)polymers

A given fluorine-containing polymer or copolymer comprises a repeat unit (discussed infra) derived from at least one ethylenically unsaturated compound containing a fluoroalcohol functional group. These fluoroalkyl groups are designated as $R_f$ and $R_f'$, which can be partially fluorinated alkyl groups or fully fluorinated alkyl groups (i.e., perfluoroalkyl groups). Broadly, $R_f$ and $R_f'$ are the same or different fluoroalkyl groups of from 1 to about 10 carbon atoms or taken together are $(CF_2)_n$ wherein n is 2 to 10. (In the last sentence, the terms "taken together" indicate that $R_f$ and $R_f'$ are not separate, discrete fluorinated alkyl groups, but that together they form a ring structure such as is illustrated below in case of a 5-membered ring:

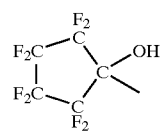

$R_f$ and $R_f'$ can be partially fluorinated alkyl groups without limit according to the invention except that there must be a sufficient degree of fluorination present to impart acidity to the hydroxyl (—OH) of the fluoroalcohol functional group, such that the hydroxyl proton is substantially removed in basic media, such as in aqueous sodium hydroxide solution or tetraalkylammonium hydroxide solution. In preferred cases according to the invention, there will be sufficient fluorine substitution present in the fluorinated alkyl groups of the fluoroalcohol functional group such that the hydroxyl group will have a pKa value as follows: 5<pKa<11. Preferably, $R_f$ and $R_f'$ are independently perfluoroalkyl group of 1 to 5 carbon atoms, and, most perferably, $R_f$ and $R_f'$ are both trifluoromethyl ($CF_3$).

As is well known to those skilled in the polymer art, an ethylenically unsaturated compound undergoes free radical polymerization to afford a polymer having a repeat unit that is derived from the ethylenically unsaturated compound. Specifically, an ethylenically unsaturated compound having structure:

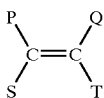

that undergoes free radical polymerization will afford a polymer having a repeat unit:

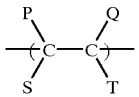

where P, Q, S, and T independently can be the same or different and illustratively could be fluorine, hydrogen, chlorine, and trifluoromethyl.

If only one ethylenically unsaturated compound undergoes polymerization, the resulting polymer is a homopolymer. If two or more distinct ethylenically unsaturated compounds undergo polymerization, the resulting polymer is a copolymer.

Some representative examples of ethylenically unsaturated compounds and their corresponding repeat units are given below:

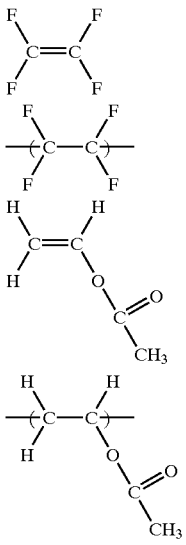

Each fluorine-containing copolymer according to this invention has an absorption coefficient of less than 4.0 $\mu m^{-1}$ at a wavelength of 157 nm, preferably of less than 3.5 $\mu m^{-1}$ at this wavelength, more preferably, of less than 3.0 $\mu m^{-1}$ at this wavelength, and, still more preferably, of less than 2.5 $\mu m^{-1}$ at this wavelength.

The fluorinated polymers, photoresists, and processes of this invention that involve a fluoroalcohol functional group may have the structure:

—XCH$_2$C(R$_f$)(R$_f'$)OH wherein R$_f$ and R$_f'$ are the same or different fluoroalkyl groups of from 1 to about 10 carbon atoms or taken together are (CF$_2$)$_n$ wherein n is 2 to 10; X is selected from the group consisting of oxygen, sulfur, nitrogen, phosphorous, other Group Va element, and other Group VIa element. By the terms "other Group Va element" and "other Group VIa element", these terms are understood to mean herein any other element in one of these groups of the periodic table that is other than the recited elements (i.e., oxygen, sulfur, nitrogen, phosphorous) in these groups. Oxygen is the preferred X group.

Some illustrative, but nonlimiting, examples of representative comonomers containing a fluoroalcohol functional group and within the scope of the invention are presented below:

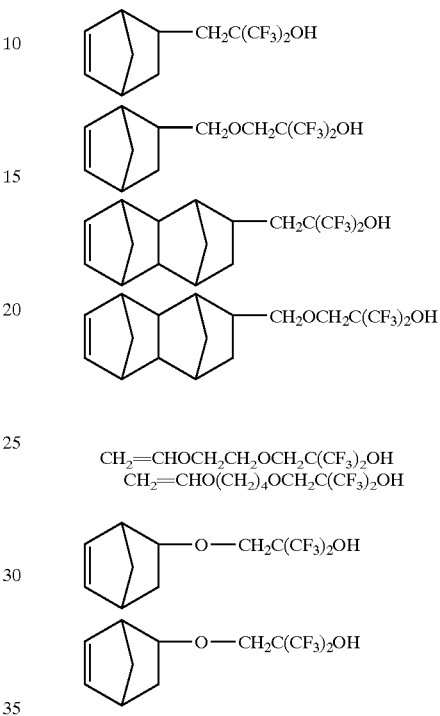

CH$_2$=CHOCH$_2$CH$_2$OCH$_2$C(CF$_3$)$_2$OH
CH$_2$=CHO(CH$_2$)$_4$OCH$_2$C(CF$_3$)$_2$OH

Various bifunctional compounds which can initially afford crosslinking and subsequently be cleaved (e.g., upon exposure to strong acid) are also useful as comonomers in the copolymers of this invention. As an illustrative, but non-limiting example, the bifunctional comonomer NB—F—OMOMO—F—NB is desirable as a comonomer in the copolymers of this invention. This and similar bifunctional comonomers, when present in the copolymer component(s) of photoresist compositions of this invention, can afford copolymers that are of higher molecular weight and are lightly crosslinked materials. Photoresist compositions, incorporating these copolymers comprised of bifunctional monomers, can have improved development and imaging characteristics, since, upon exposure (which photochemically generates strong acid as explained infra), there results cleavage of the bifunctional group and consequently a very significant drop in molecular weight, which factors can afford greatly improved development and imaging characteristics (e.g., improved contrast).

Photoactive Component (PAC)

The compositions of this invention contain at least one photoactive component (PAC) that usually is a compound that affords either acid or base upon exposure to actinic radiation. If an acid is produced upon exposure to actinic radiation, the PAC is termed a photoacid generator (PAG). If a base is produced upon exposure to actinic radiation, the PAC is termed a photobase generator (PBG).

Suitable photoacid generators for this invention include, but are not limited to, 1) sulfonium salts (structure I), 2) iodonium salts (structure II), and 3) hydroxamic acid esters, such as structure III.

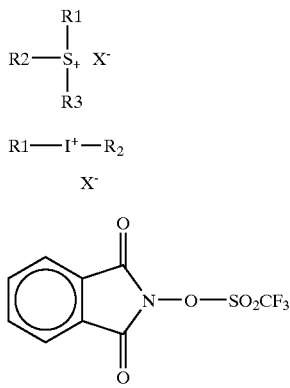

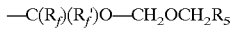

In structures I–II, $R_1$–$R_3$ are independently substituted or unsubstituted aryl or substituted or unsubstituted $C_1$–$C_{20}$ alkylaryl (aralkyl). Representative aryl groups include, but are not limited to, phenyl and naphthyl. Suitable substituents include, but are not limited to, hydroxyl (—OH) and $C_1$–$C_{20}$ alkyloxy (e.g., $C_{10}H_{21}O$. The anion X– in structures I–II can be, but is not limited to, $SbF_6$-(hexafluoroantimonate), $CF_3SO_3$-(trifluoromethylsulfonate=triflate), and $C_4F_9SO_3$-(perfluorobutylsulfonate).

Protective Groups for Removal by PAC Catalysis

The fluorine-containing copolymers of the resist compositions of this invention may contain one or more components having protected acidic fluorinated alcohol groups and/or other acid groups that can yield, by catalysis of acids or bases generated photolytically from photoactive compounds (PACs), hydrophilic acid groups which enable development of resist coatings. A given protected acid group is one that is normally chosen on the basis of its being acid labile, such that when photoacid is produced upon imagewise exposure, the acid will catalyze deprotection and production of hydrophilic acid groups that are necessary for development under aqueous conditions. In addition, the fluorine-containing copolymers may also contain acid functionality that is not protected.

Examples of components having protected acidic groups that yield an acidic group as the hydrophilic group upon exposure to photogenerated acid include, but are not limited to, A) esters capable of forming, or rearranging to, a tertiary cation, B) esters of lactone, C) acetal esters, D) β-cyclic ketone esters, E) α-cyclic ether esters, F) MEEMA (methoxy ethoxy ethyl methacrylate) and other esters which are easily hydrolyzable because of an chimeric assistance, G) carbonates formed from a fluorinated alcohol and a tertiary aliphatic alcohol. Some specific examples in category A) are t-butyl ester, 2-methyl-2-adamantyl ester, and isobornyl ester. Some specific examples in category B) are γ-butyrolactone-3-yl, γ-butyrolactone-2-yl, mavalonic lactone, 3-methyl-γ-butyrolactone-3-yl, 3-tetrahydrofuranyl, and 3-oxocyclohexyl. Some specific examples in category C) are 2-tetrahydropyranyl, 2-tetrahydrofuranyl, and 2,3-propylenecarbonate-1-yl. Additional examples in category C) include various esters from addition of vinyl ethers, such as, for example, ethoxy ethyl vinyl ether, methoxy ethoxy ethyl vinyl ether, and acetoxy ethoxy ethyl vinyl ether.

A given protected fluorinated alcohol group and/or other acid group (as referenced supra) contains a protecting group which protects the fluorinated alcohol group and/or other acid group (i.e., the protected group) from exhibiting its acidity while in this protected form. As one illustrative example, the tertiary-butyl group is the protecting group in a tertiary-butyl ester and this protecting group protects the free acid. In undergoing deprotection (conversion of protected acid to free acid), the ester is converted to the corresponding acid.

An alpha-alkoxyalkyl ether group is a preferred protecting group for the fluoroalcohol group in order to maintain a high degree of transparency in the photoresist composition. The resulting protected fluoroalcohol group has the structure:

$$-C(R_f)(R_f')O-CH_2OCH_2R_5$$

In this protected fluoroalcohol, $R_f$ and $R_f'$ are the same or different fluoroalkyl groups of from 1 to about 10 carbon atoms or taken together are $(CF_2)_n$ wherein n is 2 to 10; $R_5$ is hydrogen or a linear or branched alkyl group of between 1 and 10 carbon atoms. An illustrative, but non-limiting example, of an alpha-alkoxyalkyl ether group, which is effective as a protecting group in a protected acid group, is methoxy methyl ether (MOM). A protected fluoroalcohol with this particular protecting group can be obtained by reaction of chloromethylmethyl ether with the fluoroalcohol (as illustrated in several of the examples).

The fluoroalcohol functional group (protected or unprotected) of this invention can be used alone or it can be used in combination with one or more other acid groups, such as carboxylic acid functional group(unprotected) and t-butyl ester of carboxylic acid functional group (protected).

In this invention, often, but not always, the components having protected groups are repeat units having protected acid groups that have been incorporated in the base copolymer resins of the compositions (as discussed supra). Frequently the protected acid groups are present in one or more comonomer(s) that are polymerized to form a given copolymeric base resin of this invention. Alternatively, in this invention, a copolymeric base resin can be formed by copolymerization with an acid-containing comonomer and then subsequently acid functionality in the resulting acid-containing copolymer can be partially or wholly converted by appropriate means to derivatives having protected acid groups.

Dissolution Inhibitors and Additives

Various dissolution inhibitors can be utilized in this invention. Ideally, dissolution inhibitors (DIs) for far and extreme UV resists (e.g., 193 nm resists) should be designed/chosen to satisfy multiple materials needs including dissolution inhibition, plasma etch resistance, and adhesion behavior of resist compositions comprising a given DI additive. Some dissolution inhibiting compounds also serve as plasticizers in resist compositions.

Positive-Working and Negative-Working Photoresists

The photoresists of this invention can either be positive-working photoresists or negative-working photoresists, depending upon choice of components in the fluoropolymer, presence or absence of optional dissolution inhibitor and crosslinking agents, and the choice of developer (solvent used in development). In positive-working photoresists, the resist polymer becomes more soluble and/or dispersible in a solvent used in development in the imaged or irradiated areas whereas in a negative-working photoresist, the resist polymer becomes less soluble and/or dispersible in the imaged or irradiated areas. In one preferred embodiment of this invention, irradiation causes the generation of acid or base by the photoactive component discussed above. The acid or base may catalyze removal of protecting groups from the fluoroalcohol and optionally other acidic groups present in a fluorine-containing polymer comprising a repeat unit derived from at least one ethylenically unsaturated compound containing a fluoroalcohol functional group or a protected fluoroalcohol functional group having the structure:

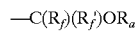

wherein $R_f$ and $R_f'$ are the same or different fluoroalkyl groups of from 1 to about 10 carbon atoms or taken together are $(CF_2)_n$ wherein n is 2 to 10 and $R_a$ is hydrogen or a protected functional group.

Development in an aqueous base such a tetramethylammonium hydroxide would result in the formation of a positive image whereas development in an organic solvent or critical fluid (having moderate to low polarity), would results in a negative-working system in which exposed areas remain and unexposed areas are removed. Positive-working photoresists are preferred.

A variety of different crosslinking agents can be employed as required or optional photoactive component(s) in the negative-working mode of this invention. (A crosslinking agent is required in embodiments that involve insolubilization in developer solution as a result of crosslinking, but is optional in preferred embodiments that involve insolubilization in developer solution as a result of polar groups being formed in exposed areas that are insoluble in organic solvents and critical fluids having moderate/low polarity). Suitable crosslinking agents include, but are not limited to, various bis-azides, such as 4,4'-diazidodiphenyl sulfide and 3,3'-diazidodiphenyl sulfone. Preferably, a negative-working resist composition containing a crosslinking agent (s) also contains suitable functionality (e.g., unsaturated C=C bonds) that can react with the reactive species (e.g., nitrenes) that are generated upon exposure to UV to produce crosslinked polymers that are not soluble, dispersed, or substantially swollen in developer solution, which consequently imparts negative-working characteristics to the composition.

Other Components

The compositions of this invention can contain optional additional components. Examples of additional components which can be added include, but are not limited to, resolution enhancers, adhesion promoters, residue reducers, coating aids, plasticizers, and $T_g$ (glass transition temperature) modifiers.

Process Steps

Imagewise Exposure

The photoresist compositions of this invention are sensitive in the ultraviolet region of the electromagnetic spectrum and especially to those wavelengths $\leq$365 nm. Imagewise exposure of the resist compositions of this invention can be done at many different UV wavelengths including, but not limited to, 365 nm, 248 nm, 193 nm, 157 nm, and lower wavelengths. Imagewise exposure is preferably done with ultraviolet light of 248 nm, 193 nm, 157 nm, or lower wavelengths, preferably it is done with ultraviolet light of 193 nm, 157 nm, or lower wavelengths, and most preferably, it is done with ultraviolet light of 157 nm or lower wavelengths. Imagewise exposure can either be done digitally with a laser or equivalent device or non-digitally with use of a photomask. Digital imaging with a laser is preferred. Suitable laser devices for digital imaging of the compositions of this invention include, but are not limited to, an argon-fluorine excimer laser with UV output at 193 nm, a krypton-fluorine excimer laser with UV output at 248 nm, and a fluorine (F2) laser with output at 157 nm. Since, as discussed supra, use of UV light of lower wavelength for imagewise exposure corresponds to higher resolution (lower resolution limit), the use of a lower wavelength (e.g., 193 nm or 157 m or lower) is generally preferred over use of a higher wavelength (e.g., 248 nm or higher).

Development

The fluorine-containing polymers in the resist compositions of this invention must contain sufficient functionality for development following imagewise exposure to UV light. Preferably, the functionality is acid or protected acid such that aqueous development is possible using a basic developer such as sodium hydroxide solution, potassium hydroxide solution, or ammonium hydroxide solution. Some preferred fluorine-containing polymers in the resist compositions of this invention are acid-containing copolymers or homopolymers comprised of at least one fluoroalcohol-containing monomer of structural unit:

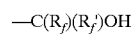

wherein $R_f$ and $R_f'$ are the same or different fluoroalkyl groups of from 1 to 10 carbon atoms or taken together are $(CF_2)_n$ wherein n is 2 to 10. The level of acidic fluoroalcohol groups is determined for a given composition by optimizing the amount needed for good development in aqueous alkaline developer.

When an aqueous processable photoresist is coated or otherwise applied to a substrate and imagewise exposed to UV light, development of the photoresist composition may require that the binder material should contain sufficient acid groups (e.g., fluoroalcohol groups) and/or protected acid groups that are at least partially deprotected upon exposure to render the photoresist (or other photoimageable coating composition) processable in aqueous alkaline developer. In case of a positive-working photoresist layer, the photoresist layer will be removed during development in portions which are exposed to UV radiation but will be substantially unaffected in unexposed portions during development by aqueous alkaline liquids such as wholly aqueous solutions containing 0.262 N tetramethylammonium hydroxide (with development at 25° C. usually for less than or equal to 120 seconds). In case of a negative-working photoresist layer, the photoresist layer will be removed during development in portions which are unexposed to UV radiation but will be substantially unaffected in exposed portions during development using either a critical fluid or an organic solvent.

A critical fluid, as used herein, is one or more substances heated to a temperature near or above its critical temperature and compressed to a pressure near or above its critical pressure. Critical fluids in this invention are at least at a temperature that is higher than 15° C. below the critical temperature of the fluid and are at least at a pressure higher than 5 atmosphers below the critical pressure of the fluid. Carbon dioxide may be used for the critical fluid in the present invention. Various organic solvents can also be used as developer in this invention. These include, but are not limited to, halogenated solvents and non-halogenated solvents. Halogenated solvents are preferred and fluorinated solvents are more preferred.

Substrate

The substrate employed in this invention can illustratively be silicon, silicon oxide, silicon nitride, or various other materials used in semiconductive manufacture.

GLOSSARY

Analytical/Measurements

| | |
|---|---|
| bs | broad singlet |
| δ | NMR chemical shift measured in the indicated solvent |
| g | gram |
| NMR | Nuclear Magnetic Resonance |
| $^1$H NMR | Proton NMR |
| $^{13}$C NMR | Carbon-13 NMR |
| $^{19}$F NMR | Fluorine-19 NMR |
| s | singlet |
| sec. | second(s) |
| m | multiplet |
| mL | milliliter(s) |
| mm | millimeter(s) |
| $T_g$ | Glass Transition Temperature |
| $M_n$ | Number-average molecular weight of a given polymer |
| $M_w$ | Weight-average molecular weight of a given polymer |
| $P = M_w/M_n$ | Polydispersity of a given polymer |
| Absorption coefficient | $AC = A/b$, where A, absorbance, $= Log_{10}(1/T)$ and b = film thickness in microns, where T = transmittance as defined below. |
| Transmittance | Transmittance, T, = ratio of the radiant power transmitted by a sample to the radiant power incident on the sample and is measured for a specified wavelength λ (e.g., nm). |

Chemicals/Monomers

| | |
|---|---|
| AdVether | 1-Adamantanemethyl vinyl ether |
| AA | Acrylic acid |
| | Aldrich Chemical Co., Milwaukee, WI |
| AIBN | 2,2'-azobisisobutyronitrile |
| | Aldrich Chemical Co., Milwaukee, WI |
| CFC-113 | 1,1,2-Trichlorotrifluoroethane |
| | (E. I. du Pont de Nemours and Company, Wilmington, DE) |
| HFIBO | Hexafluoroisobutylene epoxide |
| MAA | Methacrylic acid |
| | Aldrich Chemical Co., Milwaukee, WI |
| MEK | 2-Butanone |
| | Aldrich Chemical Co., Milwaukee, WI |
| NB | Norbornene = Bicyclo[2.2.1]hept-2-ene |
| | Aldrich Chemical Co., Milwaukee, WI |
| Perkadox ® 16 N | Di-(4-tert-butylcyclohexyl)peroxydicarbonate |
| | Noury Chemical Corp., Burt, NY |
| PGMEA | Propylene glycol methyl ether acetate |
| | Aldrich Chemical Co., Milwaukee, WI |
| TBA | Tertiary-Butyl acrylate |
| TCB | Trichlorobenzene |
| | Aldrich Chemical Co., Milwaukee, WI |
| TCDD-CO2tBu | Tetracyclododecenylcarboxylic acid tert-butyl ester = |

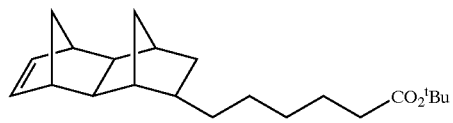

| | |
|---|---|
| TFE | Tetrafluorethylene |
| | (E. I. du Pont de Nemours and Company, Wilmington, DE) |
| THF | Tetrahydrofuran |
| | Aldrich Chemical Co., Milwaukee, WI |
| VAc | Vinyl acetate |
| | Aldrich Chemical Co., Milwaukee, WI |
| Vazo ® 52 | 2,4-Dimethyl-2,2'-azobis(pentanenitrile) |
| | (E. I. du Pont de Nemours and Company, Wilmington, DE) |
| VOH | Vinyl alcohol |
| NB-Me-OH | X=OH |
| NB-Me-F-OH | X=OCH$_2$C(CF$_3$)$_2$OH |
| NB-Me-F-OMOM | X=OCH$_2$C(CF$_3$)$_2$OCH$_2$OCH$_3$ |

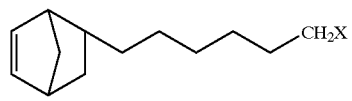

| | |
|---|---|
| NB-OAc | X=OCOCH$_3$ |
| NB-OH | X=OH |
| NB-F-OH | X=OCH$_2$C(CF$_3$)$_2$OH |
| NB-F-OMOM | X=OCH$_2$C(CF$_3$)$_2$OCH$_2$OCH$_3$ |

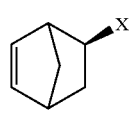

| | |
|---|---|
| VE-F-OH | CH$_2$=CHOCH$_2$CH$_2$OCH$_2$C(CF$_3$)$_2$OH |

-continued

GLOSSARY

| | |
|---|---|
| VE-F-OMOM | $CH_2=CHOCH_2CH_2OCH_2C(CF_3)_2OCH_2OCH_3$ |
| Ultraviolet | |
| Extreme UV | Region of the electromagnetic spectrum in the ultraviolet that ranges from 10 nanometers to 200 nanometers |
| Far UV | Region of the electromagnetic spectrum in the ultraviolet that ranges from 200 nanometers to 300 nanometers |
| UV | Ultraviolet region of the electromagnetic spectrum which ranges from 10 nanometers to 390 nanometers |
| Near UV | Region of the electromagnetic spectrum in the ultraviolet that ranges from 300 nanometers to 390 nanometers |
| Polymers | |
| P(TFE/HFIP-Sub-2-OH-EVE) | Poly(tetrafluoroethylene-co-hexafluoroisopropanol-substituted 2-hydroxy-ethylvinylether(copolymer of tetrafluoroethylene and comonomer 2)) |
| P(TFE/NB/NB-HFIP) | Poly(tetrafluoroethylene-co-norbornene-co-5-hexafluoroisopropanol-substituted 2-norbornene(copolymer of tetrafluoroethylene, comonomer 1, and norbornene)) |

EXAMPLES

Unless otherwise specified, all temperatures are in degrees Centigrade, all mass measurements are in grams, and all percentages are weight percentages.

Unless otherwise indicated, n, appearing within structure (s) given in the examples, represents the number of repeat units in the polymer. Throughout the specification, p, appearing within structure(s), represents the number of repeat units in the polymer.

Inherent viscosities were measured using a Cannon Auto-Visc II automated viscosity system (Cannon Instrument Company, State College, Pa. 16804) in the indicated solvents, generally at 35° C. and 1% concentration, and are reported in units of dL/g. Glass transition temperatures ($T_g$) were determined by DSC (differential scanning calorimetry) using a heating rate of 20° C./min, data is reported from the second heat. The DSC unit used is a Model DSC2910 made by TA Instruments, Wilmington, Del.

Assessment of 157 nm imaging sensitivity was done using a Lambda-Physik Compex 102 excimer laser configured for 157 nm operation. Vacuum ultraviolet transmission measurements were made using a McPherson spectrometer equipped with a D2 light source. Samples were spin-coated at several thicknesses on $CaF_2$ substrates, and the contribution of the substrate to the transmission was approximately removed by spectral division.

More specifically, all absorption coefficient measurements were made using the procedure listed below.

1. Samples were first spin-coated on silicon wafers on a Brewer Cee (Rolla, Mo.), Spincoater/Hotplate model 100CB.

a) Two to four silicon wafers were spun at different speeds (e.g., 2000, 3000, 4000, 6000 rpm) to obtain differing film thickness and the coated wafers were subsequently baked at 120° C. for 30 min. The dried films were then measured for thickness on a Gaertner Scientific (Chicago, Ill.), L116A Ellipsometer (400 to 1200 angstrom range). Two spin speeds were then selected from this data to spin the $CaF_2$ substrates for the spectrometer measurement.

b) Two $CaF_2$ substrates (1" dia.×0.80" thick) were selected and each was run as a reference data file on a McPherson Spectrometer (Chemsford, Mass.), 234/302 monochrometer, using a 632 Deuterium Source, 658 photomultiplier, and Keithley 485 picoammeter.

c) Two speeds were selected from the silicon wafer data a) to spin the sample material onto the $CaF_2$ reference substrates (e.g., 2000 and 4000 rpm) to achieve the desired film thickness. Then each was baked at 120° C. for 30 min. and the sample spectra was collected on the McPherson Spectrometer; the sample files were then divided by the reference $CaF_2$ files.

d) The resulting absorbance files were then adjusted (sample film on $CaF_2$ divided by $CaF_2$ blank) for film thickness to give absorbance per micron (abs/mic), which was done using GRAMS386 and KALEIDA-GRAPH software.

The term "clearing dose" indicates the minimum exposure energy density (e.g., in units of $mJ/cm^2$) to enable a given photoresist film, following exposure, to undergo development.

NB-OAc and NB-OH were prepared as described by Posner et al. Tetrahedron, vol. 32, page 2281 (1976) and Davies et al. J. Chem. Soc. Perkin I, page 433 (1973). Monomers $CH_2=CHCH_2C(CF_3)_2OH$ and $CH_2=C(CH_3)CH_2C(CF_3)_2OH$ were prepared by reaction of hexafluoroacetone with propylene or isobutylene, respectively, as described by Adelman, J. Org. Chem., vol. 33, pages 1400–1410 (1968). Illustrative examples of these preparations are given below. Tetracyclododecenylcarboxylic acid tert-butyl ester was purchased from Honshu Chemicals. The allyl palladium complex $[(\eta^3\text{-MeCHCHCH}_2)PdCl]_2$ used in polymerization experiments is described in the following reference: Reinmuth et al., Macromol. Rapid Commun., vol. 17, page 173 (1996).

Example 1

Preparation of 1,1-Bis(trifluoromethyl)ethylene Oxide (HFIBO)

Hexafluoroisobutene $CH_2=C(CF_3)_2$ (25 ml, 40 g) was condensed in a flask containing a solution of NaOCl (made at −5 to −3° C. by bubbling 15 g of chlorine into solution of 50 ml of 50 wt. % of NaOH in 100 ml of water) and 0.5 g of phase transfer catalyst—methyl tricaprylyl ammonium chloride—was added at −2 to +2° C. under vigorous stirring. Reaction mixture was kept at this temperature for 1–1.5 hours.

The resulting reaction mixture was transferred out of the reactor in vacuum, collected in a cold trap (at −78° C.) and distilled to give 37.5 g (yield 86%) of liquid, b.p. 42° C./760 mm Hg, which was identified as 1,1-bis(trifluoromethyl) ethylene oxide. $^1$H NMR (δ) 3.28 (s). $^{19}$F NMR (δ) 73.34 (s). $^{13}$C {H} NMR: 46.75 (s), 54.99 (sept, 37 Hz), 126.76 (q, 275) IR (gas, major): 1404 (s), 1388 (s), 1220 (s), 1083 (s), 997 (m), 871 (m), 758 (w), 690 (m), 636 (w) cm$^{-1}$. Anal. Calcd for $C_4H_2F_6O$: C, 26.68; H1.12. Found: C, 27.64; H, 1.10.

Example 2

Synthesis of $CH_2=CHOCH_2CH_2OCH_2C(CF_3)_2OH$ (VE-F—OH))

A dry 5-L round bottom flask equipped with mechanical stirrer, condenser and addition funnel was flushed with nitrogen and charged with 14.2 g (0.59 mol) of 95% sodium hydride and 400 mL of anhydrous DMF. This mixture was cooled to 10° C. and 41.6 g (0.47 mol) of 2-hydroxyethylvinyl ether was added dropwise over ½ hr. An additional 250 mL of DMF were added and the mixture was stirred for 1 hr. 1,1-Bis(trifluoromethyl)ethylene oxide (Hexafluoro-isobutylene epoxide, HFIBO) (85 g, 0.47 mol) was added over 1 hr at 20–23° C. The resulting suspension was stirrer for 22 hr. It was then transferred to a one-neck flask and most of the DMF was removed on a rotary evaporator at 0.1 mm and 29° C. The residue was dissolved in 250 mL of water and 10% hydrochloric acid was carefully added until the solution pH was about 8. An oil which separated was collected, washed with water and dried over a mixture of anhydrous sodium sulfate and potassium carbonate. The mixture was filtered and the filtrate was distilled in a Kugelrohr apparatus at 0.5 mm and 50–59° C. from a small amount of anhydrous potassium carbonate to give 89 g (71%) of oil which was stored over potassium carbonate. $^1$H NMR (δ, $C_6D_6$) 3.12 (d, 2H), 3.28 (d, 2H), 3.60 (s, 2H), 3.90 (d, 1H), 4.07 (d, 1H), 6.20 (dd, 1H). $^{19}$F NMR(δ, $C_6D_6$) –76.89 (s). Another sample prepared in the same fashion was submitted for elemental analysis. Calcd. for $C_8H_{10}F_6O_3$: C, 35.83; H, 3.76; F, 42.51. Found: C, 35.13; H, 3.92; F, 41.40.

Example 3

Synthesis of

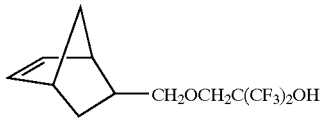

Hexafluoroisopropanol-substituted Norbornene

NB-Me-F—OH

A dry round bottom flask with mechanical stirrer and condenser was charged under nitrogen with 28.8 g (1.2 mol) of 95% sodium hydride and 400 mL of anhydrous DMF. 5-Norbornene-2-methanol (MB-ME-OH, 108.6 g, 0.875 mol) was added dropwise at room temperature over 0.5 hr. The resulting mixture was stirred for 3 hr. 1,1-Bis (trifluoromethyl)ethylene oxide (Hexafluoroisobutylene epoxide, HFIBO) (173.2 g, 0.96 mol) was added dropwise over 2 hr. The resulting mixture was stirred for 72 hr at room temperature. DMF was evaporated on a rotary evaporator at 45° C. and 1 mm. The residue was diluted with 300 mL of ice water containing 30 mL of glacial acetic acid. A lower layer was separated and the aqueous layer was extracted with 2×25 mL of methylene chloride. The combined organic layers were washed with 3×100 mL of water, dried over anhydrous magnesium chloride, filtered and distilled under vacuum in a Kugelrohr apparatus at 65–87° C. and 0.1 mm. An NMR spectrum revealed that the product was contaminated with small amounts of DMF so it was dissolved in 100 mL of hexane, washed with 4×200 mL water, dried over anhydrous magnesium sulfate, filtered and distilled in a Kugelrohr apparatus at 70–80° C. and 0.1 mm giving 233.9 g (88%) of the title product (hexafluoroisopropanol-substituted norbornene). In another preparation, the product was distilled through a 12" Vigreux column indicating a boiling point range of 52–53° C. at 0.1 mm. $^1$H NMR (δ, $CD_2Cl_2$) 0.5 to 4.3 (complex multiplets, 12 H), 5.90, 6.19 and 6.26 (m, 2H). $^{19}$F NMR (δ, $CD_2Cl_2$) –77.4 (s).). Another sample prepared in the same fashion was submitted for elemental analysis. Calcd. for $C_{12}H_{14}F_6O_2$: C, 47.37; H, 4.65; F, 37.47. Found: C, 46.15; H, 4.69; F, 37.96.

Example 4

Preparation of $CH_2=C(CH_3)CH_2C(CF_3)_2OH$

An 800 mL pressure vessel was evacuated, cooled to about –80° C. and charged with 100 g (0.6 mol) of hexafluoroacetone and 68 g (1.2 mol) of 2-methylpropene. The mixture was agitated for 72 hr at room temperature. The vessel was cooled to about 10° C. and slowly vented to atmospheric pressure. The liquid residue was removed using a small amount of methylene chloride to rinse. This mixture was distilled rapidly through a 12" Vigreux column at about 200 mm to give 136 g of crude product. This was combined with the product from another reaction on the same scale and distilled through a 12" Vigreux column giving 210 g (79%) of product: bp 72° C. at 200 mm. $^1$H NMR (δ, $C_6D_6$) 1.51 (s, 3H), 2.30 (s, 2H), 2.57 (bs, 1H), 4.52 (s, 1H), 4.70 (s, 1H). $^{19}$F NMR (δ, $C_6D_6$) –76.9 (s).

Example 5

Copolymerization of $CH_2=CHOCH_2CH_2OCH_2C(CF_3)_2OH$ and Tetrafluoroethylene

A 200 mL pressure vessel was charged with 53.6 g (0.20 mol) of $CH_2=CHOCH_2CH_2OCH_2C(CF_3)_2OH$, 75 mL of tert-butanol, 0.2 g of potassium carbonate and 0.5 g of Vazo®52 (E. I. du Pont de Nemours and Company, Wilmington, Del.). The vessel was closed, cooled in dry ice, evacuated and charged with 30 g (0.30 mol) of tetrafluoroethylene. The vessel contents were heated with agitation to 50° C. and maintained for 18 hr resulting in a pressure drop from 346 to 196 psi. The vessel was cooled to room temperature and vented. The viscous polymer solution was removed using acetone as needed to rinse. The solution was agitated until homogeneous and then added slowly to excess ice water in a blender. The precipitated solid was collected on a filter and washed with water in a blender. It was dried in a vacuum oven overnight at 44° C. giving 62.1 g (74%) of white spongy solid. $^1$H NMR (δ, THF-d8) 2.4–2.8 (m, 2H), 3.6–3–9 (m, 6H), 4.38 (bs, 1H), 6.6 (s, 1H). $^{19}$F NMR (δ, THF-d8) –77.2 (s, $CF_3$ groups), –110 to –125 (m, $CF_2$). From the integral ratio of the $^{19}$F absorptions, the polymer composition was determined to be 50.3 mole percent tetrafluoroethylene and 49.7 mole percent of the vinyl ether comonomer. DSC: Tg 11 C. Inh. Visc (1% in THF) 0.865. GPC: Mn=268400; Mw=477600; Mw/Mn=1.78. Anal. Found: C, 32.45; H, 2.40; F, 47.95. The polymer was insoluble in water but dissolved in aqueous 0.262 N tetramethylammonium hydroxide.

Example 6

Copolymerzation of TFE, Norbornene and

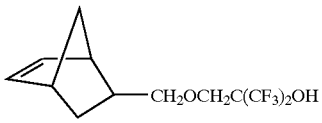

A 200 mL pressure vessel was charged with 14.1 g (0.15 mol) of norbornene, 45.6 g (0.15 mol) of the hexafluoroisopropanol-substituted norbornene, 75 mL of 1,1,2-trichlorotrifluoroethane and 1.2 g of Perkadox®16N. The vessel was closed, cooled in dry ice, evacuated and charged with 45 g (0.45 mol) of tetrafluoroethylene. The vessel contents were heated with agitation to 50° C. and maintained for 18 hr. The vessel was cooled to room temperature and vented. The polymer solution was added slowly to excess hexane. The precipitate was dried in a vacuum oven at about 50° C. giving 3.5 g of polymer. $^1$H NMR (δ, THF-d8) 0.6–4.0 (complex pattern). $^{19}$F NMR (δ, THF-d8) −78.8 (s, $CF_3$ groups), −100 to −125 (m, $CF_2$). From the integral ratio of the $^{19}$F absorptions, the molar ratio of tetrafluoroethylene units to hexafluoroisopropanol-substituted norbornene repeat units in the polymer was determined to be 1.76:1.

GPC: $M_n$=6600; $M_w$=14,100; $M_w/M_n$=2.13. DSC: $T_g$=106° C. Anal.: Found: C, 48.23; H, 4.47; F, 28.87.

Example 7

Polymerization of

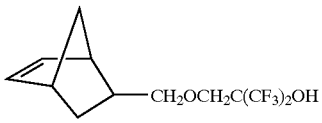

by ring-opening metathesis

Under nitrogen, 30.0 g (0.099 mol) of the hexafluoroisopropanol-substituted norbornene was dissolved in methylene chloride (30 mL). The resulting solution was added to 0.81 g (9.9×10$^{-4}$ mol) $Cl_2(PCy_3)_2Ru$=CHPh in a 100 mL round bottom flask equipped with a magnetic stirbar. An exothermic reaction ensued as the reaction mixture became viscous. The reaction could not be stirred after approximately 10 minutes. The reaction mixture was allowed to stand overnight, and the product polymer isolated by precipitation in hexane followed by drying in a vacuum oven. Yield was 24.7 grams of metathesis polymer. $^1$H NMR (acetone-d$^6$) of the polymer was consistent with the ring-opened structure shown below (drawing is not intended to convey information regarding polymer tacticity):

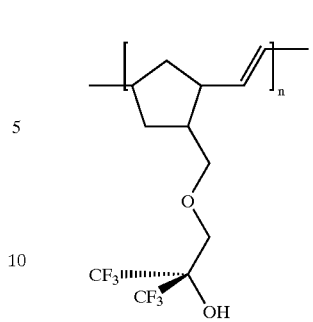

The polymer was observed to be soluble in aqueous base (0.262 N tetramethyl ammonium hydroxide).

$Cl_2(PCy_3)_2Ru$=CHPh is available from Strem Chemicals, 7 Mulliken Way, Newburyport, Mass. 01950-4098 U.S.A.

Example 8

Polymerization of

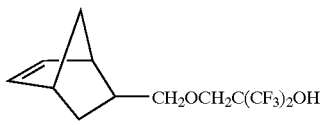

by vinyl-addition

Under nitrogen, the 0.39 g (0.99 mmol) of the allyl palladium complex [(η$^3$-MeCHCHCH$_2$)PdCl]$_2$ and 0.68 g (2.0 mmol) silver hexafluoroantimonate were suspended in chlorobenzene (90 mL). The resulting mixture was stirred at room temperature for 20 minutes. It was then filtered to removed precipitated AgCl. To the resulting gold-colored solution was added 30.0 g (0.099 mol) of the hexafluoroisopropanol-substituted norbornene. The resulting reaction mixture was stirred overnight at room temperature. The reaction mixture was then concentrated to a volume of approximately 50 mL, and the polymer isolated by precipitation in hexane followed by drying in a vacuum oven. Yield was 14.2 g of addition polymer. $^1$H NMR (CD$_2$Cl$_2$) of the polymer was consistent with the vinyl-addition polymer shown below (drawing is not intended to convey information regarding polymer tacticity):

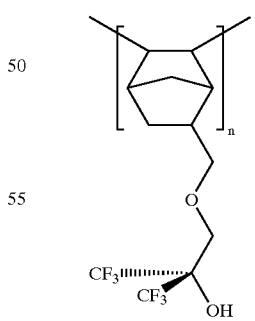

The polymer was observed to be soluble in aqueous base (0.262 N tetramethyl ammonium hydroxide).

The palladium catalyst used in the above polymerization is described in the following reference: Reinmuth, A.; Mathew, J. P.; Melia, J.; Risse W. *Macromol. Rapid Commun.* 1996, 17, 173.

Example 9

| Component | Wt. (gm) |
| --- | --- |
| 15% (wt) Solution of poly (hexafluoroisopropanol-substituted norbornene) from Example 7 dissolved in cyclohexanone | 10.8 |
| Cyclohexanone | 2.3 |
| t-Butyl Lithocholate | 0.56 |
| 5% (wt) Solution of triphenylsulfonium triflate dissolved in cyclohexanone, which was filtered through a 0.45μ PTFE syringe filter | 2.8 |

This solution was magnetically stirred overnight. Spin coating was done using a Brewer Science Inc. Model-100CB combination spin coater/hotplate on a 5 in. diameter silicon wafer, Type "P", 1.00 orient. Development was performed on a Litho Tech Japan Co. Resist Development Analyzer (Model-790).

The wafer was prepared by depositing 6 ml of hexamethyldisilazane (HMDS) primer and spinning at 1000 rpm for 5 sec. and then 3500 rpm for 10 sec. Then 6 ml of the above solution, after filtering through a 0.45μ syringe filter, was deposited and spun at 5000 rpm for 60 seconds and baked at 120° C. for 60 seconds. The coated wafer was exposed to 248 nm light obtained by passing broadband UV light from an ORIEL Model-82421 Solar Simulator (1000 watt) through a 248 nm interference filter which passes about 30% of the energy at 248 nm. Exposure time was 30 sec through a mask with 18 positions of varying neutral optical density to allow various exposure doses. The exposed wafer was then baked at 120° C. for 120 seconds. The wafer was developed in tetramethyl-ammonium hydroxide (TMAH) solution (ONKA NMD-W, 2.38% TMAH solution) for 1 minute to give a positive image.

Example 10

Copolymerization of

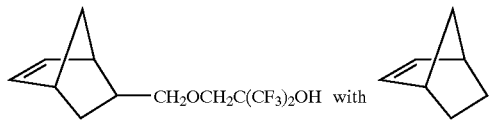

by vinyl-addition polymerization

Under nitrogen, 0.125 g (0.319 mmol) of allyl palladium complex [(η³-MeCHCHCH₂)PdCl]₂ and 0.219 g (0.637 mmol) silver hexafluoroantimonate were suspended in chlorobenzene (40 mL). The resulting mixture was stirred at room temperature for 15 minutes. It was then filtered to removed precipitated AgCl. To the resulting gold-colored solution was added a solution of 6.46 g (21.2 mol) of the hexafluoroisopropanol-substituted norbornene and 1.00 g norbornene (10.62 mmol) dissolved in 5 mL chlorobenzene. The resulting reaction mixture was stirred overnight at room temperature. The reaction mixture was then concentrated to dryness and the polymer washed with hexane and dried in a vacuum oven. Yield=7.48 g of addition polymer. ¹H NMR (CD₂Cl₂) of the polymer was consistent with a random copolymer with the approximate molar composition shown below (drawing is not intended to convey information regarding polymer tacticity):

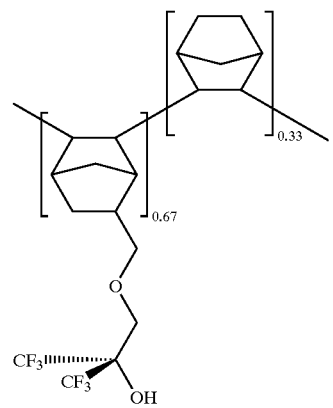

Example 11

| Component | Wt. (gm) |
| --- | --- |
| Addition copolymer of the norbornene fluoroalcohol and norbornene described in Example 10 | 2.18 |
| Cyclohexanone | 15.3 |
| t-Butyl Lithocholate | 0.76 |
| 5% (wt) Solution of triphenylsulfonium triflate dissolved in cyclohexanone, which was filtered through a 0.45u PTFE syringe filter | 1.8 |

This solution was magnetically stirred overnight. Spin coating was done using a Brewer Science Inc. Model-100CB combination spin coater/hotplate on a 5 in. diameter silicon wafer, Type "P", 1.00 orient. Development was performed on a Litho Tech Japan Co. Resist Development Analyzer (Model-790).

The wafer was prepared by depositing 6 ml of hexamethyldisilazane (HMDS) primer and spinning at 1000 rpm for 5 sec. and then 3500 rpm for 10 sec. Then 6 ml of the above solution, after filtering through a 0.45μ syringe filter, was deposited and spun at 5000 rpm for 60 seconds and baked at 120° C. for 60 seconds. The coated wafer was exposed to 248 nm light obtained by passing broadband UV light from an ORIEL Model-82421 Solar Simulator (1000 watt) through a 248 nm interference filter which passes about 30% of the energy at 248 nm. Exposure time was 30 sec through a mask with 18 positions of varying neutral optical density to allow various exposure doses. The exposed wafer was then baked at 120° C. for 120 seconds. The wafer was developed in tetramethyl-ammonium hydroxide (TMAH) solution (ONKA NMD-W, 2.38% TMAH solution) to give a positive image.

Example 12

Synthesis of NB-Me-F—OMOM

A dry round bottom flask equipped with magnetic stirrer, addition funnel, thermocouple and nitrogen inlet was charged with 4.05 g (0.16 mol) of 95% sodium hydride and 300 mL THF. This mixture was cooled to 0° C. and a solution of 46.0 g (0.151 mol) NB-Me-F—OH (product from Example 3) in 30 mL THF was added dropwise resulting in an exotherm to 8° C. After addition was complete, the homogeneous solution was stirred at 5° C. for 1 hr. A solution of 12.0 mL (0.158 mol) chloromethyl methyl ether (Aldrich Chemical Company) in 20 mL THF was added dropwise resulting in an exotherm to 10° C. The mixture was stirred for 3 hr at room temperature while a precipitate formed. The mixture was filtered and the solid rinsed with 4×20 mL of THF. The combined filtrate and washings were concentrated on the rotary evaporator to an oil. Distillation of the oil in a Kugelrohr apparatus at 40–50° C. and 0.13 torr gave 43.2 g (82%) of the title product. $^1$H NMR (δ, CDCl$_3$) 0.4–3.3 (m, 9H), 3.45 (3, 3H), 3.80–4.10 (m, 2H), 5.00–5.20 (m, 2H), 5.85–6.00 (m, 1H), 6.10–6.20 (m, 1H). $^{19}$F NMR (δ, CDCl$_3$) −74.6 (s). Another sample prepared in the same fashion was submitted for elemental analysis. Calcd. for C$_{14}$H$_{18}$F$_6$O$_3$: C, 48.27; H, 5.22; F, 32.73. Found: C, 48.54; H, 5.57; F, 29.96.

Example 13

Synthesis of NB—F—OH

A dry round bottom flask equipped with mechanical stirrer, addition funnel and nitrogen inlet was swept with nitrogen and charged with 19.7 g (0.78 mol) of 95% sodium hydride and 500 mL of anhydrous DMF. The stirred mixture was cooled to 5° C. and 80.1 g (0.728 mol) of exo-5-norborene-2-ol was added dropwise so that the temperature remained below 15° C. The resulting mixture was stirred for ½ hr. HFIBO (131 g, 0.728 mol) was added dropwise at room temperature. The resulting mixture was stirred overnight at room temperature. Methanol (40 mL) was added and most of the DMF was removed on a rotary evaporator under reduced pressure. The residue was treated with 200 mL water and glacial acetic acid was added until the pH was about 8.0. The aqueous mixture was extracted with 3×150 mL ether. The combined ether extracts were washed with 3×150 mL water and 150 mL brine, dried over anhydrous sodium sulfate and concentrated on a rotary evaporator to an oil. Kugelrohr distillation at 0.15–0.20 torr and a pot temperature of 30–60° C. gave 190.1 (90%) of product. $^1$H NMR (δ, CD$_2$Cl$_2$) 1.10–1.30 (m, 1H), 1.50 (d, 1H), 1.55–1.65 (m, 1H), 1.70 (s, 1H), 1.75 (d, 1H), 2.70 (s, 1H), 2.85 (s, 1H), 3.90 (d, 1H), 5.95 (s, 1H), 6.25 (s, 1H). Another sample prepared in the same fashion was submitted for elemental analysis. Calcd. for C$_{11}$H$_{12}$F$_6$O$_2$: C, 45.53; H, 4.17; F, 39.28. Found: C, 44.98; H, 4.22; F, 38.25.

Example 14

Synthesis of NB—F—OMOM

A dry round bottom flask equipped with magnetic stirrer, addition funnel, thermocouple and nitrogen inlet was charged with 5.05 g (0.2 mol) of 95% sodium hydride and 200 mL THF. The mixture was cooled to 0° C. and 55.7 g (0.192 mol) NB—F—OH was added dropwise resulting in H$_2$ evolution and an exotherm to 6° C. The mixture was stirred for 2 hr giving a yellow homogeneous solution. Chloromethyl methyl ether (15.2 mL, 0.2 mol) (Aldrich Chemical Company) was added dropwise. The resulting mixture was stirred overnight with formation of a precipitate. The mixture was filtered and the solid was washed with 3×50 mL THF. The combined filtrate and washings were concentrated on a rotary evaporator to a yellow oil. Distillation of the oil in a Kugelrohr apparatus at 30–47° C. and 0.13 torr gave, after a small foreshot, 47.1 g (73%) of product. $^1$H NMR (δ, CDCl$_3$) 1.40 (m, 1H), 1.58 (m, 2H), 1.68 (m, 1H), 2.78 (s, 1H), 2.90 (s, 1H), 3.45 (s, 3H), 3.50 (m, 1H), 4.08 (dd, 1H), 5.08 (s, 2H), 5.96 (m, 1H), 6.11 (m, 1H). $^{19}$F NMR (δ, CDCl$_3$) −76.8 (s). Another sample prepared in the same fashion was submitted for elemental analysis. Calcd. for C$_{13}$H$_{16}$F$_6$O$_3$: C, 46.71; H, 4.82; F, 34.10. Found: C, 46.26; H, 5.03; F, 32.01.

Example 15

Synthesis of VE-F—OMOM

A round bottom flask with mechanical stirrer, thermocouple, addition funnel and nitrogen inlet was swept with nitrogen and charged with 300 mL of anhydrous THF and 13.1 g (0.52 mol) of 95% sodium hydride. 2-Hydroxyethylvinyl ether (45.4 g, 0.5 mol) was added dropwise so that the reaction temperature did not exceed 35° C. Additional THF was added to the resulting slurry as needed to facilitate stirring. After stirring for 1 hr at room temperture, the mixture was cooled to about 0° C. and HFIBO (93.9 g, 0.52 mol) was added dropwise. An exotherm to about 40° C. was observed and the reaction mixture became a homogeneous solution. It was stirrer overnight at room temperature. The solution was cooled to 0° C. and chloromethylmethyl ether (41.8 g, 0.52 mol) was added dropwise resulting in an exotherm to 5° C. and formation of a precipitate. This mixture was stirred overnight at room temperature. The mixture was filtered and the solid was washed with 100 mL THF. The combined filtrate and washings were concentrated on the rotary evaporator to an oil which was distilled on a Kugelrohr at 0.13 torr and 30° C. The distillate was purified by flash chromatography using 9/1 hexane/ethyl acetate to elute. There was isolated 82.3 g (53%) of product as an oil. $^1$H NMR (δ, CDCl$_3$) 3.44 (s, 3H), 3.75 (m, 2H), 3.85 (m, 2H), 4.04 (dd, 1H), 4.17 (s, 2H), 4.20 (dd, 1H), 5.10 (s, 2H), 6.50 (dd, 1H). $^{19}$F NMR (δ, CDCl$_3$) −74.4. Another sample prepared in the same fashion was submitted for elemental analysis. Calcd. for C$_{10}$H$_{14}$F$_6$O$_4$: C, 38.47; H, 4.52; F, 36.51. Found: C, 38.47; H, 4.69; F, 33.92.

Example 16

Terpolymer of VE-F—OH, tert-Butyl Acrylate and TFE

A 200 mL pressure vessel was charged with 32.2 g (0.12 mol) of VE-F—OH, 5.12 g (0.04 mol) tert-butyl acrylate, 40 mL of tert-butanol, 30 mL methyl acetate, 0.5 g of potassium carbonate and 0.4 g of Vazo®52 (E. I. du Pont de Nemours and Company, Wilmington, Del.). The vessel was closed, cooled in dry ice, evacuated and charged with 24 g (0.24 mol) of TFE. The vessel contents were heated with agitation to 50° C. and maintained for 18 hr resulting in a pressure drop from 277 to 202 psi. The vessel was cooled to room temperature and vented. The viscous polymer solution was removed using acetone as needed to rinse and filtered. The filtrate was added slowly to excess ice water in a blender. The precipitated polymer was filtered, washed with water and dried in a vacuum oven at 55° C. to give 41.6 g of the title polymer. $^1$H NMR (δ, THF-d8) 1.45 (s) and 1.3–2.0 (integral=32) (t-Butyl acryate), 2.6 (m), 3.7 (s), 3.8 (s) and 4.35 (m) (integral=60.8) (VE-F—OH). $^{19}$F NMR (δ, THF-d8) −110 to −125 (m, integral=60.7, CF2), −75.8 (s, intergral=100). From the $^1$H and $^{19}$F NMR spectra, the polymer composition was calculated to contain repeat units derived as follows: 43 mole % derived from TFE, 40 mole % derived from VE-F—OH and 17 mole % derived from tert-butyl acrylate. GPC: M$_n$=109200, M$_w$=362900, M$_w$/M$_n$=3.32. DSC: Tg=17.5° C. Anal. Found: C, 36.25; H, 3.45; F, 45.73. A 5 weight % solution of the polymer in cyclohexanone was made for spin-coating, film sample(s) were spin coated, and the absorption coefficient at 157 nm was determined to be 2.26 μm$^{-1}$ at a film thickness of 137 nm indicating a high degree of transparency.

Example 17

Terpolymer of VE-F—OH, tert-Butyl Acrylate and TFE with Lower Molecular Weight The procedure of Example 16 was followed using 40.2 g (0.15 mol) of VE-F—OH, 6.4 g (0.05 mol) tert-butyl acrylate, 50 mL of tert-butanol, 25 mL isopropanol, 0.5 g of potassium carbonate, 0.5 g of Vazo®52 and 30 g of TFE. The isopropanol functions as a chain transfer agent. There was isolated 32.2 g of polymer having repeat units derived as follows: 38 mole % derived from TFE, 41 mole % derived from VE-F—OH and 21 mole % derived from tert-butyl acrylate by NMR analysis. GPC: $M_n$=3900, $M_w$=11600, $M_w/M_n$=2.96. Anal. Found: C, 36.87; H, 3.73; F, 42.97.

Example 18

Tetrapolymer of Norbornene, VE-F—OH, tert-Butyl Acrylate and TFE

A 200 mL pressure vessel was charged with 14.1 g (0.15 mol) norbornene, 20.1 g (0.075 mol) VE-F—OH, 9.6 g (0.075 mol) tert-butyl acrylate, 50 mL of 1,1,2-trichlorotrifluomoethane, 25 mL of tert-butanol, 0.5 g of potassium carbonate and 1.2 g of Perkadox®16N. The vessel was closed, cooled in dry ice, evacuated and charged with 45 g (0.45 mol) of tetrafluoroethylene. The vessel contents were heated with agitation to 50° C. and maintained for 18 hr. The vessel was cooled to room temperature and vented. The polymer solution was removed using acetone to rinse. The solution was concentrated on a rotary evaporator. The residue was dissolved in THF and precipitated into excess ice water. The solid was isolated, dissolved in TFE and precipitated into a excess of 50% methanol in water. The solid was isolated and dried in a vacuum oven giving 29.4 g of polymer. GPC: $M_n$=11600, $M_w$=21900; $M_w/M_n$=1.89. DSC: Tg=46° C. Anal. Found: C, 51.29; H, 5.88; F, 26.98. A 5 wt % solution of the polymer in 2-heptanone was made for spin-coating, film sample(s) were spin coated, and the absorption coefficient at 157 nm was determined to be 3.19 $\mu m^{-1}$ at a film thickness of 78.6 nm and 3.26 $\mu m^{-1}$ at a film thickness of 62.5 nm.

Example 19

Terpolymer of Norbornene, NB—F—OH and TFE

A 200 mL pressure vessel was charged with 18.8 g (0.20 mol) of norbornene, 29.0 g (0.10 mol) of NB—F—OH, 75 mL of 1,1,2-trichlorotrifluoroethane and 1.2 g of Perkadox®16N. The vessel was closed, cooled in dry ice, evacuated and charged with 45 g (0.45 mol) of TFE. The vessel contents were heated with agitation to 50° C. and maintained for 18 hr. The vessel was cooled to room temperature and vented. The polymer solution was added slowly to a tenfold excess of methanol while stirring. The precipitate was filtered, washed with methanol and dried in a vacuum oven at 75° C. to give 13.9 g of the title polymer. $^{19}$F NMR ($\delta$, THF-d8) −75.7 (s, $CF_3$ groups), −95 to −125 (m, $CF_2$). From the integral ratio of these peaks, the polymer was calculated to have repeat units in a 4.2:1 mole ratio of repeat units derived from TFE to repeat units derived from NB—F—OH. $^{13}$C NMR ($\delta$, $CD_2Cl_2$) 20–45 (int=448.63), 64 (int=14.65), 74–86 (int=31.92), 114–128 (int=149.56). From the integral ratios of the carbon spectrum, the polymer was calculated to contain repeat units derived as follows: 47 mole % derived from tetrafluoroethylene, 40 mole % derived from norbornene and 12 mole % derived from NB—F—OH. GPC: $M_n$=7300, $M_w$=11000. $M_w/M_n$=1.51. DSC: $T_g$=157° C. Anal. Found: C, 51.47; H, 4.76; F, 38.07.

Example 20

Copolymer of VE-F—OMOM and TFE

A 200 mL pressure vessel was charged with 49.9 g (0.16 mol) of VE-F—OMOM, 75 mL of tert-butanol, 0.5 g of potassium carbonate and 0.4 g of Vazo®52 (E. I. du Pont de Nemours and Company, Wilmington, Del.). The vessel was closed, cooled in dry ice, evacuated and charged with 24 g (0.24 mol) of tetrafluoroethylene. The vessel contents were heated with agitation to 50° C. and maintained for 18 hr resulting in a pressure drop from 288 to 178 psi. The vessel was cooled to room temperature and vented. The viscous polymer solution was removed using acetone as needed to rinse. THF (120 mL) was added and the mixture was agitated until homogeneous. The polymer solution was added slowly to and 11-fold excess of hexane. The precipitated solid was collected on a filter, allowed to air dry and then dried in a vacuum oven overnight at 70° C. giving 44.7 g (60%) of an elastic solid. $^1$H NMR ($\delta$, THF-d8) 2.58 (m, 2H), 3.40 (s, 3H), 3.67 (s, 2H), 3.68 (s, 2H), 4.17 (s, 2H), 4.37 (m, 1H), 5.08 (s, 2H). $^{19}$F NMR ($\delta$, THF-d8) −73.8 (s, $CF_3$ groups), −105 to −125 (m, $CF_2$). From the integral ratio of the $^{19}$F absorptions, the polymer composition was determined to be composed of repeat units as follows: 51 mole % derived from TFE and 49 mole % derived from VE-F—OMOM. DSC: $T_g$=−21° C. GPC: $M_n$=82800; $M_w$=304800; $M_w/M_n$=3.68. Anal. Found: C, 35.56; H, 3.51; F, 45.61.

Example 21

Terpolymer of Norbornene, NB—F—OMOM and TFE

A 200 mL pressure vessel was charged with 18.8 g (0.20 mol) of norbornene, 33.8 g (0.10 mol) of NB—F—OH, 75 mL of 1,1,2-trichlorotrifluoroethane and 1.2 g of Perkadox®16N. The vessel was closed, cooled in dry ice, evacuated and charged with 45 g (0.45 mol) of TFE. The vessel contents were heated with agitation to 50° C. and maintained for 18 hr. The vessel was cooled to room temperature and vented. The polymer solution was added slowly to a tenfold excess of methanol while stirring. The precipitate was filtered, washed with methanol and dried in a vacuum oven at 75° C. to give 21.9 g of the title polymer. $^1$H NMR ($\delta$, $CDCl_3$) 1.0–3.0 (m) plus peaks at 3.45, 4.0 and 5.0 assigned to 8 H from the NB—F—OMOM monomer. $^{19}$F NMR ($\delta$, $CDCl_3$) −74 ($CF_3$) and −95 to −125 ($CF_2$). From integrations of the NMR spectra, this polymer was calculated to contain repeat units derived as follows: 46 mole % derived from TFE, 41 mole % derived from norbornene and 13 mole % derived from NB—F—OMOM. GPC: $M_n$=5600, $M_w$=8400, $M_w/M_n$=1.51. DSC: $T_g$=127° C. Anal. Found: C, 50.01; H, 4.35; F, 38.89. A 5 wt % solution of the polymer in 2-heptanone was made for spin-coating, film sample(s) were spin coated, and the absorption coefficient at 157 nm was determined to be 1.62 $\mu m^{-1}$ at a film thickness of 76.9 nm and 1.92 $\mu m^{-1}$ at a film thickness of 44.8 nm, indicating that the polymer is a highly transparent material.

Example 22

Copolymer of NB—F—OH and TFE

A 200 mL pressure vessel was charged with 58.0 g (0.20 mol) of NB—F—OH, 75 mL of 1,1,2- trichlorotrifluoroethane and 0.8 g of Perkadox®16N. The vessel was closed, cooled in dry ice, evacuated and charged with 30 g (0.30 mol) of TFE. The vessel contents were heated with agitation to 50° C. and maintained for 18 hr. The vessel was cooled to room temperature and vented. The polymer solution was added slowly to a tenfold excess of hexane while stirring. The precipitate was filtered and dried in a vacuum oven at 100° C. to give 7.1 g of polymer. $^1$H NMR (δ, THF-d8) 1.0–3.0 (m, 8H), 3.3–4.1 (m, 3H), 6.8 (m, 1H). $^{19}$F NMR (δ, THF-d8) –75.6 (s, CF$_3$), –95 to –125 (m, CF$_2$). DSC: $T_g$=142° C. Anal. Found: C, 42.13; H, 3.62; F, 45.14. The polymer dissolved in 0.26 M aqueous tetramethylammonium hydroxide. A 5 wt % solution of the polymer in 2-heptanone was made for spin-mating, film sample (s) were spin coated, and the absorption coefficient at 157 nm was determined to be 1.27 μm$^{-1}$ at a film thickness of 67.5 nm and 1.40 μm$^{-1}$ at a film thickness of 52.3 nm, indicating that the polymer is a highly transparent material.

Example 23

Terpolymer of NB—F—OH, NB—F—OMOM and TFE

A 200 mL pressure vessel was charged with 29.0 g (0.10 mol) of NB—F—OH, 33.4 g (0.10 mol) of NB—F—OMOM, 75 mL of 1,1,2-trichlorotrifluoroethane and 0.8 g of Perkadox®16N. The vessel was closed, cooled in dry ice, evacuated and charged with 30 g (0.30 mol) of TFE. The vessel contents were heated with agitation to 50° C. and maintained for 18 hr. The vessel was cooled to room temperature and vented. The polymer solution was added slowly to a tenfold excess of hexane while stirring. The precipitate was filtered and dried in a vacuum oven at 100° C. to give 7.2 g of polymer. 1H NMR (δ, THF-d8) 1.0–3.0 (m), 3.3–4.1 (m), 5.0 (s), 6.8 (m, 1H). 19F NMR (δ, THF-d8) –73.8 (s, CF3), –75.7 (s, CF$_3$), –95 to –125 (m, CF$_2$). From integration of the 19F NMR spectrum, the polymer composition was calculated to contain repeat units derived as follows: 27 mole % derived from NB—F—OH, 27 mole % derived from NB—F—OMOM and 46 mole % derived from TFE. In contrast to the polymer from Example 22, this polymer was found to be insoluble in 0.26 M aqueous tetramethylammonium hydroxide. A 5 wt % solution of the polymer in 2-heptanone was made for spin-coating, film sample(s) were spin coated, and the absorption coefficient at 157 nm was determined to be 2.40 μm$^{-1}$ at a film thickness of 69.2 nm and 2.17 μm$^{-1}$ at a film thickness of 54.9 nm.

Example 24

Terpolymer of Norbornene, CH$_2$=CHCH$_2$C(CF$_3$)$_2$OH and TFE

A 200 mL pressure vessel was charged with 18.6 g (0.20 mol) of norbornene, 20.8 g (0.10 mol) of CH$_2$=CHCH$_2$C(CF$_3$)$_2$OH, 80 mL of 1,1,2-trichlorotrifluoroethane and 1.2 g of Perkadox®16N. The vessel was closed, cooled in dry ice, evacuated and charged with 45 g (0.45 mol) of TFE. The vessel contents were heated with agitation to 50° C. and maintained for 18 hr. The vessel was cooled to room temperature and vented. The vessel contents were added slowly to an excess of methanol. The precipitate was washed with methanol and dried in a vacuum oven to give 6.7 g of polymer. $^{19}$F NMR (δ, THF-d8) –75 to –79 (CF$_3$) and –95 to –125 (CF$_2$). From integration of the spectrum the ratio of repeat units derived from TFE to repeat units derived from CH$_2$=CHCH$_2$C(CF$_3$)$_2$OH, in the polymer was calculated to be 1:0.19. DSC: $T_g$=132° C. GPC: M$_n$=5400, M$_w$=8200, M$_w$/M$_n$=1.52. Anal. Found: C, 50.62; H, 4.61; F, 42.76.

Example 25

Homopolymer of NB-Me-F—OMOM

This example demonstrates homopolymerization of a methoxy methyl ether-protected norbornene fluoroalcohol, to give a polymer that is insoluble in aqueous base developer and has good transparency at 157 nm (Abs<4 μm$^{-1}$). Under nitrogen, 0.045 g (0.11 mmol) of the allyl palladium complex [(η$^3$-MeCHCHCH$_2$)PdCl]$_2$ and 0.08 g (0.23 mmol) silver hexafluoroantimonate were suspended in chlorobenzene (20 mL). The resulting mixture was stirred at room temperature for 30 minutes. It was then filtered to remove precipitated AgCl. The resulting solution was added to 4.0 g (11.5 mmol) of NB-Me-F—OMOM. The resulting reaction mixture was stirred for two days at room temperature. The reaction mixture was then concentrated to dryness. The crude product was taken up in acetone to give a 4 wt. % solution, and filtered through a 0.2 μm nylon filter; the acetone filtrate was then concentrated to dryness, affording 2.19 g of addition polymer. GPC: M$_n$=8253, M$_w$=15073, M$_w$/M$_n$=1.83. Anal. Found: C, 47.83; H, 5.34; F, 30.31. $^1$H (acetone-d$_6$) and $^{13}$C (CD$_2$Cl$_2$) NMR spectra of the polymer were consistent with the saturated vinyl-addition polymer shown below:

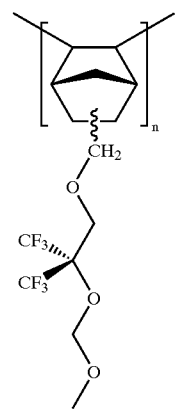

The polymer was found to be insoluble in 0.26 N aqueous tetramethylammnonium hydroxide, but soluble in organic solvents including ketones. A 5 wt. % solution in 2-heptanone was made for spin-coating, film sample(s) were spin coated, and the absorption coefficient at 157 nm was measured at two different film thicknesses. Results obtained were the following: 3.67 μm$^{-1}$ (537 Å film thickness) and 3.63 μm$^{-1}$ (644 Å film thickness).

Example 26

Copolymer of NB-Me-F—OH and NB-Me-F—OMOM

This example demonstrates copolymerization of an unprotected norbornene fluoroalcohol with a methoxy methyl ether-protected norbornene fluoroalcohol (molar feed ratio=75/25), to give a copolymer that is insoluble in aqueous base developer. Under nitrogen, 0.24 g (0.61 mmol) of the allyl palladium complex [(η$^3$-MeCHCHCH$_2$)PdCl]$_2$ and 0.43 g (1.2 mmol) silver hexafluoroantimonate were suspended in chlorobenzene (30 mL). The resulting mixture was stirred at room for 30 minutes. It was then filtered to remove precipitated AgCl. The resulting solution was added to a mixture of 5.33 g (15.3 mmol) NB-Me-F—OMOM, 14.0 g (46.0 mmol) NB-Me-F—OH, and chlorobenzene (~80 mL). The resulting reaction mixture was stirred for 3 days at room temperature. The crude product polymer was isolated by precipitation in hexane. This material was taken up in acetone to give a 4 wt. % solution, and filtered through a 0.2 μm nylon filter; the acetone filtrate was then concentrated to dryness, affording 9.6 g of addition copolymer. GPC: $M_n$=13119; $M_w$=17916; $M_w/M_n$=1.37. Anal. Found: C, 47.30; H, 4.76; F, 33.77. $^{19}$F NMR (δ, THF-d8) −74.8 [$(CF_3)_2COCH_2OMe$], −77.8 [$(CF_3)_2COH$]. $^1$H ($CD_2Cl_2$) and $^{13}$C ($CD_2Cl_2$) NMR spectra were consistent with a random saturated vinyl addition copolymer. From integration of the $^{19}$F and $^{13}$C NMR absorptions the polymer was determined to contain repeat units derived as follows: 79 mole % derived from NB-Me-F—OH and 21 mole % derived from NB-Me-F—OMOM. The polymer was found to be insoluble in 0.26 N aqueous tetramethylammonium hydroxide, but soluble in organic solvents including ketones. A 5 weight % solution in 2-heptanone was made for spin-coating, film sample(s) were spin coated, and the absorption coefficient at 157 nm was measured at two different film thicknesses. Results obtained are the following: 3.45 $\mu m^{-1}$ (562 Å film thickness) and 3.29 $\mu m^{-1}$ (699 Å film thickness).

Example 27

Copolymer of NB-Me-F—OH and NB-Me-F—OMOM

This example demonstrates copolymerization of an unprotected norbornene fluoroalcohol with a methoxy methyl ether-protected norbornene fluoroalcohol (molar feed ratio=80/20), to give a copolymer that is insoluble in aqueous base developer. Under nitrogen, 0.24 g (0.61 mmol) of the allyl palladium complex [$(\eta^3$-MeCHCHCH$_2$)PdCl]$_2$ and 0.43 g (1.2 mmol) silver hexafluoroantimonate were suspended in chlorobenzene (30 mL). The resulting mixture was stirred at room for 30 minutes. It was then filtered to remove precipitated AgCl. The resulting solution was added to a mixture of 4.3 g (12.3 mmol) NB-Me-F—OMOM, 15.0 g (49.0 mmol) NB-Me-F—OH, and chlorobenzene (~80 mL). The resulting reaction mixture was stirred for 1 day at room temperature. The crude product polymer was isolated by precipitation in hexane. This material was taken up in acetone to give a 4 wt. % solution, and filtered through a 0.2 μm nylon filter; the acetone filtrate was then concentrated to dryness, affording 6.3 g of addition copolymer. GPC: $M_n$=9838; $M_w$=19384; $M_w/M_n$=1.97. Anal. Found: C, 46.38; H, 4.27; F, 31.98. $^{19}$F NMR (δ, THF-d$_8$) −74.8 [$(CF_3)_2$COCH$_2$OMe], −77.8 [$(CF_3)_2$COH]. $^1$H (acetone-d$_6$) and $^{13}$C (CD$_2$Cl$_2$) NMR spectra were consistent with a random saturated vinyl addition copolymer. From integration of the $^{19}$F NMR absorptions the polymer was determined to contain repeat units derived as follows: 80 mole % derived from NB-Me-F—OH and 20 mole % derived from NB-Me-F—OMOM. Quantitative $^{13}$C NMR was consistent with the polymer being derived from repeat units as follows: 85 mole % derived from NB-Me-F—OH and 15 mole % derived from NB-Me-F—OMOM. The polymer was found to be insoluble in 0.26 N aqueous tetramethylammonium hydroxide, but soluble in organic solvents including ketones.

Example 28

Copolymer of NB-Me-F—OH and NB-Me-F—OMOM

This example demonstrates copolymerization of an unprotected norbornene fluoroalcohol with a methoxy methyl ether-protected norbornene fluoroalcohol (molar feed ratio=85/15), to give a copolymer that is sparingly soluble in aqueous base developer. Under nitrogen, 0.24 g (0.61 mmol) of the allyl palladium complex [$(\eta^3$-MeCHCHCH$_2$)PdCl]$_2$ and 0.43 g (1.2 mmol) silver hexafluoroantimonate were suspended in chlorobenzene (30 mL). The resulting mixture was stirred at ambient temperature for 30 minutes. It was then filtered to remove precipitated AgCl. The resulting solution was added to a mixture of 3.2 g (9.2 mmol) NB-Me-F—OMOM, 15.8 g (52.0 mmol) NB-Me-F—OH, and chlorobenzene (~80 mL). The resulting reaction mixture was stirred for 2 days at room temperature. The reaction mixture was then concentrated to dryness. The crude product was washed with hexane, taken up in acetone to give a 4 weight % solution, and filtered through a 0.2 μm nylon filter; the acetone filtrate was then concentrated to dryness, affording 9.0 g of addition polymer. GPC: $M_n$=12636; $M_w$=18889; $M_w/M_n$=1.49. Anal. Found: C, 46.12; H, 4.68; F, 35.79. $^{19}$F NMR (δ, THF-d$_8$) −74.8 [$(CF_3)_2$COCH$_2$OMe], −77.9 [$(CF_3)_2$COH]. $^1$H (CD$_2$Cl$_2$) and $^{13}$C (CD$_2$Cl$_2$) NMR spectra were consistent with a random saturated vinyl-addition copolymer. From integration of the $^{19}$F NMR absorptions the polymer was determined to contain repeat units derived as follows: 84 mole % derived from NB-Me-F—OH and 16 mole % derived from NB-Me-F—OMOM. Quantitative $^{13}$C NMR was consistent with this polymer having repeat units derived as follows: 89 mole % derived from NB-Me-F—OH and 11 mole % derived from NB-Me-F—OMOM. The polymer was found to be sparingly soluble in 0.26 N aqueous tetramethylammnonium hydroxide, but soluble in organic solvents including ketones. A 5 weight % solution in 2-heptanone was made for spin-coating, film sample(s) were spin coated, and the absorption coefficient at 157 nm was measured at two different film thicknesses: Results obtained were the following: 3.37 $\mu m^{-1}$ (580 Å film thickness) and 2.97 $\mu m^{-1}$ (703 Å film thickness).

Example 29

Copolymer of NB-Me-F—OH and NB-Me-F—OMOM

This example demonstrates copolymerization of an unprotected norbornene fluoroalcohol with a methoxy methyl ether-protected norbornene fluoroalcohol (molar feed ratio=90/10), to give a copolymer that is soluble in aqueous base developer. Under nitrogen, 0.25 g (0.64 mmol) of the allyl palladium complex [$(\eta^3$-MeCHCHCH$_2$)PdCl]$_2$ and 0.44 g (1.27 mmol) silver hexafluoroantimonate were suspended in chlorobenzene (30 mL). The resulting mixture was stirred at room temperature for 30 minutes. It was then filtered to remove precipitated AgCl. The resulting solution was added to a mixture of 2.2 g (6.4 mmol) NB-Me-F—OMOM, 17.5 g (57.6 mmol) NB-Me-F—OH, and chlorobenzene (~80 mL). The resulting reaction mixture was stirred for three days at room temperature. The crude product polymer was isolated by precipitation in hexane. This material was taken up in acetone to give a 4 weight % solution, and filtered through a 0.2 μm nylon filter; the acetone filtrate was then concentrated to dryness, affording 9.4 g of addition copolymer. GPC: $M_n$=11079; $M_w$=19457; $M_w/M_n$=1.76. Anal. Found: C, 46.14; H, 4.70; F, 33.75. $^1$H (CD$_2$Cl$_2$) and $^{13}$C (CD$_2$Cl$_2$) NMR spectra of the copolymer were consistent with a random saturated vinyl-addition copolymer. From integration of the $^{19}$F NMR absorptions, the polymer was determined to contain repeat units derived as follows: 89 mole % derived from NB-Me-F—OH and 11 mole % derived from NB-Me-F—OMOM. Quantitative $^{13}$C NMR was consistent with the polymer having repeat units derived as follows: 92 mole % derived from NB-Me-F—OH and 8 mole % derived from NB-Me-F—OMOM. The polymer was found to be soluble in 0.26 N aqueous tetramethylammonium hydroxide.

Example 30

Homopolymer of NB-Me-F—OH

This example demonstrates homopolymerization of an unprotected norbornene fluoroalcohol, to give a polymer that is soluble in aqueous base developer and has excellent transparency at 157 nm. Under nitrogen, 0.19 g (0.49 mmol) of the allyl palladium complex [(η³-MeCHCHCH$_2$)PdCl]$_2$ and 0.34 g (0.98 mmol) silver hexafluoroantimonate were suspended in chlorobenzene (40 mL). The resulting mixture was stirred at room temperature for 30 minutes. It was then filtered to remove precipitated AgCl, and an additional 10 mL chlorobenzene added. The resulting solution was added to 15.0 g (49.0 mmol) of NB-Me-F—OH. The resulting reaction mixture was stirred for three days at room temperature. The crude product polymer was isolated by precipitation in hexane. This material was taken up in acetone to give a 10 weight % solution, and filtered through a 0.2 μm Teflon® filter, the acetone filtrate was then concentrated to dryness, affording 7.8 g of addition copolymer. GPC: $M_n$=10352; Mw=19741; $M_w/M_n$=1.91. Anal. Found: C, 46.28; H, 4.81; F, 34.22. $^1$H NMR (CD$_2$Cl$_2$) of the polymer was consistent with the saturated vinyl-addition polymer shown below:

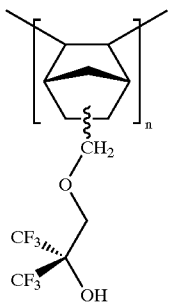

The polymer was found to be soluble in 0.26 N aqueous tetramethylammonium hydroxide, and in organic solvents including ketones. A 5 wt. % solution in 2-heptanone was made for spin-coating, film sample(s) were spin coated, and the absorption coefficient at 157 nm was measured at two different film thicknesses. Results obtained were the following: 2.80 μm$^{-1}$ (484 Å film thickness) and 3.00 μm$^{-1}$ (564 Å film thickness). The plasma etch rate the homopolymer was measured; it was found to etch at 1.61× the rate of a Novolak control in an oxygen plasma. In a polysilicon etch using HBr/Cl plasma, the homopolymer was found to etch at 1.1× the rate of a para-hydroxystyrene-based DUV (248 nm) resist.

Example 31

Hompolymer of NB—F—OH

Using a procedure analogous to that described in Example 30, the 100% exo norbornene fluoroalcohol NB—F—OH was polymerized in 32% yield. $^1$H NMR (acetone-d$_6$) of the polymer was consistent with the saturated vinyl-addition polymer shown below:

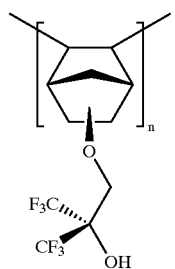

GPC: $M_n$=3975; $M_w$=183026; $M_w/M_n$=13.1. This material was found to be soluble in 0.26 N aqueous tetramethylammonium hydroxide. Film samples of this polymer were made by spin-coating. The absorption coefficient at 157 nm for this polymer was measured at two different film thicknesses. Results obtained were the following: 2.35 μm$^{-1}$ (1144 Å film thickness) and 2.47 μm$^{-1}$ (883 Å film thickness).

Example 32

Terpolymer of NB-Me-F—OH, NB-Me-OH and TCDD-CO$_2$tBu

This example demonstrates that a certain amount of an ester-containing comonomer can be incorporated into a fluoroalcohol copolymer, while maintaining reasonable transparency at 157 nm. Under nitrogen, 0.37 g (0.94 mmol) of the allyl palladium complex [(η³-MeCHCHCH$_2$)PdCl]$_2$ and 0.65 g (1.9 mmol) silver hexafluoroantimonate were suspended in chlorobenzene (40 mL). The resulting mixture was stirred at room for 30 minutes. It was then filtered to remove precipitated AgCl. The resulting solution was added to a mixture of 1.17 g (9.4 mmol) NB-Me-OH, 20.0 g (65.7 mmol) NB-Me-F—OH, and 4.9 g (18.8 mmol) tetracyclododecenylcarboxylic acid tert-butyl ester. The resulting reaction mixture was stirred for two days at room temperature. The crude product polymer was isolated by precipitation in hexane (600 mL). This material was taken up in acetone to give a 4 weight % solution, and filtered through a 0.2 μm nylon filter: the acetone filtrate was then concentrated to dryness, affording 8.9 g of addition copolymer. GPC: $M_n$=10396; $M_w$=17948; $M_w/M_n$=1.73. Anal. Found: C, 52.68; H, 5.62; F, 25.87. $^{13}$C NMR (acetone-d$_6$) of the polymer was consistent with a random saturated vinyl-addition copolymer with the molar composition of repeat units derived as follows: 53 mole % derived from NB-Me-F—OH, 20 mole % derived from TCDD-CO$_2$tBu, and 27 mole % derived from NB-Me-OH. The absorption coefficient at 157 nm for spin-coated films of this polymer was measured at two different film thicknesses. Results obtained were the following: 3.71 μm$^{-1}$ (605 Å film thickness) and 3.77 μm$^{-1}$ (519 Å film thickness).

Example 33

The following solution was prepared and magnetically stirred overnight.

| Component | Wt. (gm) |
| --- | --- |
| TFE/NB-F-OH copolymer (60/40 molar feed ratio) as described in Example 22 | 0.312 |

-continued

| Component | Wt. (gm) |
|---|---|
| 2-Heptanone | 1.800 |
| Cyclohexanone | 1.648 |
| t-Butyl Lithocholate | 0.080 |
| 5% (wt) solution of triphenylsulfonium triflate dissolved in cyclohexanone which had been filtered through a 0.45μ PTFE syringe filter | 0.160 |

Spin coating was done using a Brewer Science Inc. Model-100CB combination spin coater/hotplate on a 4 in. diameter Type "P", <100> orientation, silicon wafer. Development was performed on a Litho Tech Japan Co. Resist Development Analyzer (Model-790).

The wafer was prepared by depositing 6 ml of hexamethyldisilazane (HMDS) primer and spinning at 1000 rpm for 5 sec. and then 3500 rpm for 10 sec. Then 6 ml of the above solution, after filtering through a 0.2 μm PTFE syringe filter, was deposited and spun at 3000 rpm for 60 seconds and baked at 120° C. for 60 seconds.

248 nm imaging was accomplished by exposing the coated wafer to light obtained by passing broadband UV light from an ORIEL Model-82421 Solar Simulator (1000 watt) through a 248 nm interference filter which passes about 30% of the energy at 248 nm. Exposure time was 30 seconds, providing an unattenuated dose of 20.5 mJ/cm². By using a mask with 18 positions of varying neutral optical density, a wide variety of exposure doses were generated. After exposure the exposed wafer was baked at 120° C. for 120 seconds.

The wafer was developed in aqueous tetramethylammonium hydroxide (TMAH) solution (ONKA NMD-3, 2.38% TMAH solution). This test generated a positive image with a clearing dose of ≈12 mJ/cm².

Example 34

The following solution was prepared and magnetically stirred overnight.

| Component | Wt. (gm) |
|---|---|
| TFE/NB-F-OH/NB-F-OMOM copolymer (60/20/20 molar feed ratio) as described in Example 23 | 0.312 |
| 2-Heptanone | 1.801 |
| Cyclohexanone | 1.648 |
| t-Butyl Lithocholate | 0.080 |
| 5% (wt) solution of triphenylsulfonium triflate dissolved in cyclohexanone which had been filtered through a 0.45μ PTFE syringe filter | 0.160 |

Spin coating was done using a Brewer Science Inc. Model-100CB combination spin coater/hotplate on a 4 in. diameter Type "P", <100> orientation, silicon wafer. Development was performed on a Litho Tech Japan Co. Resist Development Analyzer (Model-790).

The wafer was prepared by depositing 6 ml of hexamethyldisilazane (HMDS) primer and spinning at 1000 rpm for 5 sec. and then 3500 rpm for 10 sec. Then 6 ml of the above solution, after filtering through a 0.2 μm PTFE syringe filter, was deposited and spun at 3000 rpm for 60 seconds and baked at 120° C. for 60 seconds.

248 nm imaging was accomplished by exposing the coated wafer to light obtained by passing broadband UV light from an ORIEL Model-82421 Solar Simulator (1000 watt) through a 248 nm interference filter which passes about 30% of the energy at 248 nm. Exposure time was 60 seconds, providing an unattenuated dose of 41 mJ/cm². By using a mask with 18 positions of varying neutral optical density, a wide variety of exposure doses were generated. After exposure the exposed wafer was baked at 120° C. for 120 seconds.

The wafer was developed in aqueous tetramethylammonium hydroxide (TMAH) solution (ONKA NMD-3, 2.38% TMAH solution). This test generated a positive image with a clearing dose of ≈23 mJ/cm².

Example 35

The following solution was prepared and magnetically stirred overnight.

| Component | Wt. (gm) |
|---|---|
| NB-Me-F-OH/NB-Me-F-OMOM copolymer (75/25 molar feed ratio) as described in Example 26 | 0.702 |
| Cyclohexanone | 4.758 |
| t-Butyl Lithocholate | 0.180 |
| 5% (wt) solution of triphenylsulfonium triflate dissolved in cyclohexanone which had been filtered through a 0.45μ PTFE syringe filter | 0.360 |

Spin coating was done using a Brewer Science Inc. Model-100CB combination spin coater/hotplate on a 4 in. diameter Type "P", <100> orientation, silicon wafer, Development was performed on a Litho Tech Japan Co. Resist Development Analyzer (Model-790).

The wafer was prepared by depositing 6 ml of hexamethyldisilazane (HMDS) primer and spinning at 1000 rpm for 5 sec. and then 3500 rpm for 10 sec. Then 6 ml of the above solution, after filtering through a 0.2 μm PTFE syringe filter, was deposited and spun at 3000 rpm for 60 seconds and baked at 120° C. for 60 seconds.

248 nm imaging was accomplished by exposing the coated wafer to light obtained by passing broadband UV light from an ORIEL Model-82421 Solar Simulator (1000 watt) through a 248 nm interference filter which passes about 30% of the energy at 248 nm. Exposure time was 30 seconds, providing an unattenuated dose of 20.5 mJ/cm². By using a mask with 18 positions of varying neutral optical density, a wide variety of exposure doses were generated. After exposure the exposed wafer was baked at 120° C. for 120 seconds.

The wafer was developed in aqueous tetramethylammonium hydroxide (TMAH) solution (ONKA NMD-3, 2.38% TMAH solution). This test generated a positive image with a clearing dose of ≈4.3 mJ/cm².

Example 36

The following solution was prepared and magnetically stirred overnight.

| Component | Wt. (gm) |
|---|---|
| NB-Me-F-OH/NB-Me-F-OMOM copolymer (80/20 molar feed ratio) as described in Example 27 | 0.769 |

-continued

| Component | Wt. (gm) |
| --- | --- |
| Cyclohexanone | 4.758 |
| t-Butyl Lithocholate | 0.113 |
| 5% (wt) solution of triphenylsulfonium triflate dissolved in cyclohexanone which had been filtered through a 0.45µ PTFE syringe filter | 0.360 |

Spin coating was done using a Brewer Science Inc. Model-100CB combination spin coater/hotplate on a 4 in. diameter Type "P", <100> orientation, silicon wafer. Development was performed on a Litho Tech Japan Co. Resist Development Analyzer (Model-790).

The wafer was prepared by depositing 6 ml of hexamethyldisilazane (HMDS) primer and spinning at 1000 rpm for 5 sec. and then 3500 rpm for 10 sec. Then 6 ml of the above solution, after filtering through a 0.2 µm PTFE syringe filter, was deposited and spun at 3000 rpm for 60 seconds and baked at 120° C. for 60 seconds.

248 nm imaging was accomplished by exposing the coated wafer to light obtained by passing broadband UV light from an ORIEL Model-82421 Solar Simulator (1000 watt) through a 248 nm interference filter which passes about 30% of the energy at 248 nm. Exposure time was 60 seconds, providing an unattenuated dose of41 mJ/cm². By using a mask with 18 positions of varying neutral optical density, a wide variety of exposure doses were generated. After exposure the exposed wafer was baked at 120° C. for 120 seconds.

The wafer was developed in aqueous tetramethylammnonium hydroxide (TMAH) solution (ONKA NMD-3, 2.38% TMAH solution). This test generated a positive image with a clearing dose of ≈5.5 mJ/cm².

Example 37

The following solution was prepared and magnetically stirred overnight.

| Component | Wt. (gm) |
| --- | --- |
| NB-Me-F-OH/NB-Me-F-OMOM copolymer (85/15 molar feed ratio) as described in Example 28 | 0.769 |
| Cyclohexanone | 4.758 |
| t-Butyl Lithocholate | 0.113 |
| 5% (wt) solution of triphenylsulfonium triflate dissolved in cyclohexanone which had been filtered through a 0.45µ PTFE syringe filter | 0.360 |

Spin coating was done using a Brewer Science Inc. Model-100CB combination spin coater/hotplate on a 4 in. diameter Type "P", <100> orientation, silicon wafer. Development was performed on a Litho Tech Japan Co. Resist Development Analyzer (Model-790).

The wafer was prepared by depositing 6 ml of hexamethyldisilazane (HMDS) primer and spinning at 1000 rpm for 5 sec. and then 3500 rpm for 10 sec. Then 6 ml of the above solution, after filtering through a 0.2 µm PTFE syringe filter, was deposited and spun at 3000 rpm for 60 seconds and baked at 120° C. for 60 seconds.

248 nm imaging was accomplished by exposing the coated wafer to light obtained by passing broadband UV light from an ORIEL Model-82421 Solar Simulator (1000 watt) through a 248 nm interference filter which passes about 30% of the energy at 248 nm. Exposure time was 60 seconds, providing an unattenuated dose of 41 mJ/cm². By using a mask with 18 positions of varying neutral optical density, a wide variety of exposure doses were generated. After exposure the exposed wafer was baked at 120° C. for 120 seconds.

The wafer was developed in aqueous tetraethylammonium hydroxide (TMAH) solution (ONKA NMD-3, 2.38% TMAH solution). This test generated a positive image with a clearing dose of ≈25 mJ/cm².

Example 38

The following solution was prepared and magnetically stirred overnight.

| Component | Wt. (gm) |
| --- | --- |
| NB-Me-F-OH/NB-Me-F-OMOM copolymer (90/10 molar feed ratio) as described in Example 29 | 0.468 |
| Cyclohexanone | 5.172 |
| t-Butyl Lithocholate | 0.120 |
| 5% (wt) solution of triphenylsulfonium triflate dissolved in cyclohexanone which had been filtered through a 0.45µ PTFE syringe filter | 0.240 |

Spin coating was done using a Brewer Science Inc. Model-100CB combination spin coater/hotplate on a 4 in. diameter Type "P", <100> orientation, silicon wafer. Development was performed on a Litho Tech Japan Co. Resist Development Analyzer (Model-790).

The wafer was prepared by depositing 6 ml of hexamethyldisilazane (HMDS) primer and spinning at 1000 rpm for 5 sec. and then 3500 rpm for 10 sec. Then 6 ml of the above solution, after filtering through a 0.45 µm PTFE syringe filter, was deposited and spun at 3000 rpm for 60 seconds and baked at 120° C. for 60 seconds.

248 nm imaging was accomplished by exposing the coated wafer to light obtained by passing broadband UV light from an ORIEL Model-82421 Solar Simulator (1000 watt) through a 248 mm interference filter which passes about 30% of the energy at 248 nm. Exposure time was 30 seconds, providing an unattenuated dose of 20.5 mJ/cm². By using a mask with 18 positions of varying neutral optical density, a wide variety of exposure doses were generated. After exposure the exposed wafer was baked at 120° C. for 120 seconds.

The wafer was developed in aqueous tetramethylamnonium hydroxide (TMAH) solution (ONKA NMD3, 2.38% TMAH solution). This test generated a positive image with a clearing dose of ≈20.5 mJ/cm².

Example 39

The following solution was prepared and magnetically stirred overnight.

| Component | Wt. (gm) |
| --- | --- |
| TFE/NB-F-OH copolymer (60/40 molar feed ratio) as described in Example 22 | 0.312 |
| 2-Heptanone | 1.800 |
| Cyclohexanone | 1.648 |
| t-Butyl Lithocholate | 0.080 |

-continued

| Component | Wt. (gm) |
| --- | --- |
| 5% (wt) solution of triphenylsulfonium triflate dissolved in cyclohexanone which had been filtered through a 0.45µ PTFE syringe filter | 0.160 |

Spin coating was done using a Brewer Science Inc. Model-100CB combination spin coater/hotplate on a 4 in. diameter Type "P", <100> orientation, silicon wafer. Development was performed on a Litho Tech Japan Co. Resist Development Analyzer (Model-790).

The wafer was prepared by depositing 6 ml of hexamethyldisilazane (HMDS) primer and spinning at 1000 rpm for 5 sec. and then 3500 rpm for 10 sec. Then 6 ml of the above solution, after filtering through a 0.45 u PTFE syringe filter, was deposited and spun at 5000 rpm for 60 seconds and baked at 120° C. for 60 seconds.

Open frame 157 nm imaging was accomplished by exposing the coated wafer to light from a Lambda-Physik Compex 102 excimer laser configured for 157 nm operation. The imaging dose was controlled by varying the number of laser pulses used to expose a given spot on the wafer. Eight spots were imaged with doses that varied from 3.0 mJ/cm$^2$ to 190 mJ/cm$^2$. After exposure the exposed wafer was baked at 120° C. for 120 seconds.

The wafer was developed in aqueous tetramethylammonium hydroxide (TMAH) solution (ONKA NMD-3, 2.38% TMAH solution). The lowest dose that gave a positive image was 24 mJ/cm$^2$. The lowest dose that produced regions of negative image was 190 mJ/cm$^2$. (High doses can afford negative imaging by various mechanisms, including crosslinking resulting from radical production upon UV exposure of a photoresist containing a photoacid generator.)

Example 40

The following solution was prepared and magnetically stirred overnight.

| Component | Wt. (gm) |
| --- | --- |
| TFE/NB-F-OH/NB-F-OMOM copolymer (60/20/20 molar feed ratio) as described in Example 23 | 0.460 |
| 2-Heptanone | 5.120 |
| t-Butyl Lithocholate | 0.120 |
| 6.82% (wt) solution of triphenylsulfonium nonaflate dissolved in 2-heptanone which had been filtered through a 0.45µ PTFE syringe filter. | 0.300 |

Spin coating was done using a Brewer Science Inc. Model-100CB combination spin coater/hotplate on a 4 in. diameter Type "P", <100> orientation, silicon wafer. Development was performed on a Litho Tech Japan Co. Resist Development Analyzer (Model-790).

The wafer was prepared by depositing 6 ml of hexamethyldisilazane (HMDS) primer and spinning at 1000 rpm for 5 sec. and then 3500 rpm for 10 sec. Then 6 ml of the above solution, after filtering through a 0.45 u PTFE syringe filter, was deposited and spun at 5000 rpm for 60 seconds and baked at 120° C. for 60 seconds.

Open frame 157 nm imaging was accomplished by exposing the coated wafer to light from a Lambda-Physik Compex 102 excimer laser configured for 157 nm operation. The imaging dose was controlled by varying the number of laser pulses used to expose a given spot on the wafer. Eight spots were imaged with doses that varied from 3.0 mJ/cm$^2$ to 190 mJ/cm$^2$. After exposure the exposed wafer was baked at 120° C. for 120 seconds.

The wafer was developed in aqueous tetramethylammonium hydroxide (TMAH) solution (ONKA NMD-3, 2.38% TMAH solution). The lowest dose that gave a positive image was 50 mJ/cm$^2$. The lowest dose that produced regions of negative image was 190 mJ/cm$^2$.

Example 41

The following solution was prepared and magnetically stirred overnight, and diluted with cyclohexanone to 12% Solids.

| Component | Wt. (gm) |
| --- | --- |
| NB-Me-F-OH/NB-Me-F-OMOM copolymer (75/25 molar feed ratio) as described in Example 26 | 0.769 |
| Cyclohexanone | 4.758 |
| t-Butyl Lithocholate | 0.113 |
| 5% (wt) solution of triphenylsulfonium triflate dissolved in cyclohexanone which had been filtered through a 0.45µ PTFE syringe filter | 0.360 |

Spin coating was done using a Brewer Science Inc. Model-100CB combination spin coater/hotplate on a 4 in. diameter Type "P", <100> orientation, silicon wafer. Development was performed on a Litho Tech Japan Co. Resist Development Analyzer (Model-790).

The wafer was prepared by depositing 6 ml of hexamethyldisilazane (HMDS) primer and spinning at 1000 rpm for 5 sec. and then 3500 rpm for 10 sec. Then 6 ml of the above solution, after filtering through a 0.45 u PTFE syringe filter, was deposited and spun at 5000 rpm for 60 seconds and baked at 120° C. for 60 seconds.

Open frame 157 nm imaging was accomplished by exposing the coated wafer to light from a Lambda-Physik Compex 102 excimer laser configured for 157 nm operation. The imaging dose was controlled by varying the number of laser pulses used to expose a given spot on the wafer. Eight spots were imaged with doses that varied from 4 mJ/cm$^2$ to 128 mJ/cm$^2$. After exposure the exposed wafer was baked at 120° C. for 120 seconds.

The wafer was developed in aqueous tetramethylammonium hydroxide (TMAH) solution (ONKA NMD-3, 2.38% TMAH solution). The lowest dose that gave a positive image was 15 mJ/cm$^2$. The lowest dose that produced regions of negative image was 50 mJ/cm$^2$.

Example 42

The following solution was prepared and magnetically stirred overnight, and diluted with cyclohexanone to 12% Solids.

| Component | Wt. (gm) |
| --- | --- |
| NB-Me-F-OH/NB-Me-F-OMOM copolymer (80/20 molar feed ratio) as described in Example 27 | 0.769 |
| Cyclohexanone | 4.758 |

-continued

| Component | Wt. (gm) |
|---|---|
| t-Butyl Lithocholate | 0.113 |
| 5% (wt) solution of triphenylsulfonium triflate dissolved in cyclohexanone which had been filtered through a 0.45μ PTFE syringe filter | 0.360 |

Spin coating was done using a Brewer Science Inc. Model-100CB combination spin coater/hotplate on a 4 in. diameter Type "P", <100> orientation, silicon wafer. Development was performed on a Litho Tech Japan Co. Resist Development Analyzer (Model-790).

The wafer was prepared by depositing 6 ml of hexamethyldisilazane (HMDS) primer and spinning at 1000 rpm for 5 sec. and then 3500 rpm for 10 sec. Then 6 ml of the above solution, after filtering through a 0.20 μm PTFE syringe filter, was deposited and spun at 3000 rpm for 60 seconds and baked at 120° C. for 60 seconds.

Open frame 157 nm imaging was accomplished by exposing the coated wafer to light from a Lambda-Physik Compex 102 excimer laser configured for 157 nm operation. The imaging dose was controlled by varying the number of laser pulses used to expose a given spot on the wafer. Six spots were imaged with doses that varied from 1.25 mJ/cm$^2$ to 300 mJ/cm$^2$. After exposure the exposed wafer was baked at 120° C. for 120 seconds.

The wafer was developed in aqueous tetramethylammonium hydroxide (TMAH) solution (ONKA NMD-3, 2.38% TMAH solution). The lowest dose that gave a positive image was 11 mJ/cm$^2$. The lowest dose that produced regions of negative image was 100 mJ/cm$^2$.

Example 43

The following solution was prepared and magnetically stirred overnight.

| Component | Wt. (gm) |
|---|---|
| NB-Me-F-OH/NB-Me-F-OMOM copolymer (85/15 molar feed ratio) as described in Example 28 | 0.307 |
| Cyclohexanone | 2.470 |
| t-Butyl Lithocholate | 0.045 |
| 5% (wt) solution of triphenylsulfonium triflate dissolved in cyclohexanone which had been filtered through a 0.45μ PTFE syringe filter | 0.181 |

Spin coating was done using a Brewer Science Inc. Model-100CB combination spin coater/hotplate on a 4 in. diameter Type "P", <100> orientation, silicon wafer. Development was performed on a Litho Tech Japan Co. Resist Development Analyzer (Model-790).

The wafer was prepared by depositing 6 ml of hexamethyldisilazane (HMDS) primer and spinning at 1000 rpm for 5 sec. and then 3500 rpm for 10 sec. Then 6 ml of the above solution, after filtering through a 0.20 μm PTFE syringe filter, was deposited and spun at 3000 rpm for 60 seconds and baked at 120° C. for 60 seconds.

Open frame 157 nm imaging was accomplished by exposing the coated wafer to light from a Lambda-Physik Compex 102 excimer laser configured for 157 nm operation. The imaging dose was controlled by varying the number of laser pulses used to expose a given spot on the wafer. Seven spots were imaged with doses that varied from 2.7 mJ/cm$^2$ to 180 mJ/cm$^2$. After exposure the exposed wafer was baked at 120° C. for 120 seconds.

The wafer was developed in aqueous tetramethylammonium hydroxide (TMAH) solution (ONKA NMD-3, 2.38% TMAH solution). The lowest dose that gave a positive image 43 mJ/cm$^2$. The lowest dose that produced regions of negative image was 180 mJ/cm$^2$.

Example 44

The following solution was prepared and magnetically stirred overnight, and diluted with cyclohexanone to 12% Solids.

| Component | Wt. (gm) |
|---|---|
| NB-Me-F-OH/NB-Me-F-OMOM copolymer (90/10 molar feed ratio) as described in Example 29 | 0.769 |
| Cyclohexanone | 4.758 |
| t-Butyl Lithocholate | 0.113 |
| 5% (wt) solution of triphenylsulfonium triflate dissolved in cyclohexanone which had been filtered through a 0.45μ PTFE syringe filter | 0.360 |

Spin coating was done using a Brewer Science Inc. Model-100CB combination spin coater/hotplate on a 4 in. diameter Type "P", <100> orientation, silicon wafer. Development was performed on a Litho Tech Japan Co. Resist Development Analyzer (Model-790).

The wafer was prepared by depositing 6 ml of hexamethyldisilazane (HMDS) primer and spinning at 1000 rpm for 5 sec. and then 3500 rpm for 10 sec. Then 6 ml of the above solution, after filtering through a 0.20 μm PTFE syringe filter, was deposited and spun at 3000 rpm for 60 seconds and baked at 120° C. for 60 seconds.

Open frame 157 nm imaging was accomplished by exposing the coated wafer to light from a Lambda-Physik Compex 102 excimer laser configured for 157 nm operation. The imaging dose was controlled by varying the number of laser pulses used to expose a given spot on the wafer. Eight spots were imaged with doses that varied from 2.5 mJ/cm$^2$ to 160 mJ/cm$^2$. After exposure the exposed wafer was baked at 120° C. for 120 seconds.

The wafer was developed in aqueous tetraethylammonium hydroxide (TMAH) solution (ONKA NMD3, 2.38% TMAH solution). The lowest dose that gave a positive image was 20 mJ/cm$^2$. The lowest dose that produced regions of negative image was 160 mJ/cm$^2$.

What is claimed is:

1. A photoresist comprising:
   (a) a fluorine-containing polymer comprising a repeat unit derived from at least one ethylenically unsaturated compound containing a fluoroalcohol functional group having the structure:

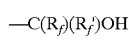

wherein $R_f$ and $R_f'$ are the same or different fluoroalkyl groups of from 1 to 10 carbon atoms or taken together are $(CF_2)_n$ wherein n is 2 to 10; and
   (b) at least one photoactive component;
   wherein the fluorine-containing polymer has an absorption coefficient of less than 2.5 $\mu m^{-1}$ at a wavelength of 157 nm.

2. The photoresist of claim 1, further comprising a dissolution inhibitor.

3. The photoresist of claim 1, wherein the fluorine-containing polymer has an absorption coefficient of less than 3.0 $\mu m^{-1}$ at a wavelength of 157 nm.

4. The photoresist of claim 1, wherein the fluorine-containing polymer further comprises a repeat unit derived from at least one ethylenically unsaturated compound containing a functional group having the structure

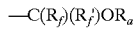

wherein $R_f$ and $R_f'$ are the same or different fluoroalkyl groups of from 1 to 10 carbon atoms or taken together are $(CF_2)_n$ wherein n is 2 to 10 and $R_a$ is an acid- or base-labile protecting group.

5. The photoresist of claim 4, wherein $R_a$ in the fluorine-containing polymer is $CH_2OCH_2R_5$, and $R_5$ is hydrogen or a linear or branched alkyl group of between 1 to 10 carbon atoms.

6. The process of claim 1 which is a positive working resist.

7. The photoresist of claim 6 which further comprises at least one protected functional group.

8. The photoresist of claim 7 wherein the functional group of the at least one protected functional group is selected from the group consisting of an acidic functional group and a basic functional group.

9. The photoresist of claim 8 wherein the functional group of the protected functional group is selected from the group consisting of carboxylic acid and fluoroalcohol.

10. The photoresist of claim 1 wherein $R_f$ and $R_f'$ are $CF_3$.

11. A process for preparing a photoresist image on a substrate comprising, in order:

(W) applying a photoresist composition on a substrate, wherein the photoresist composition comprises:
(a) a fluorine-containing polymer comprising a repeat unit derived from at least one ethylenically unsaturated compound containing a fluoroalcohol functional group having the structure:

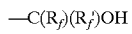

wherein $R_f$ and $R_f'$ are the same or different fluoroalkyl groups of from 1 to 10 carbon atoms or taken together are $(CF_2)_n$ wherein n is 2 to 10, and wherein the fluorine-containing polymer has an absorption coefficient of less than 2.5 $\mu m^{-1}$ at a wavelength of 157 nm;
(b) at least one photoactive component; and
(c) a solvent;

(X) drying the photoresist composition to substantially remove the solvent and thereby form a photoresist layer on the substrate;

(Y) imagewise exposing the photoresist layer to form imaged and non-imaged areas; and (Z) developing the exposed photoresist layer having imaged and non-imaged areas to form the relief image on the substrate.

12. The process of claim 11 wherein the imagewise exposure is performed using ultraviolet radiation having a wavelength of 157 nm.

13. The process of claim 11 wherein the imagewise exposure is performed using ultraviolet radiation having a wavelength of 193 nm.

14. The process of claim 11 wherein the photoresist composition in light exposed areas is rendered soluble in aqueous base developer upon exposure to patterned ultraviolet radiation of wavelength less than or equal to 365 nm.

15. The process of claim 11, wherein the fluorine-containing polymer further comprises a repeat unit derived from at least one ethylenically unsaturated compound containing a functional group having the structure

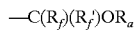

wherein $R_f$ and $F_f'$ are the same or different fluoroalkyl groups of from 1 to 10 carbon atoms or taken together are $(CF_2)_n$ wherein n is 2 to 10 and $R_a$ is an acid- or base-labile protecting group.

16. The process of claim 15 wherein $R_a$ in the fluorine-containing polymer is $CH_2OCH_2R_5$, and $R_5$ is hydrogen or a linear or branched alkyl group of between 1 and 10 carbon atoms.

17. The process of claim 11 wherein the exposed layer is developed with an aqueous alkaline developer.

18. The process of claim 11 wherein the developing step is performed with a developer selected from the group consisting of a critical fluid, a halogenated organic solvent, and a non-halogenated organic solvent.

19. The process of claim 18 wherein the critical fluid is carbon dioxide.

20. The process of claim 18 wherein the halogenated solvent is a fluorocarbon compound.

21. The process of claim 11 wherein $R_f$ wherein $R_f'$ are $CF_3$.

22. A fluorine-containing copolymer comprising a repeat unit derived from at least one ethylenically unsaturated compound characterized in that at least one ethylenically unsaturated compound is cyclic or polycyclic, at least one ethylenically unsaturated compound contains at least one fluorine atom covalently attached to an ethylenically unsaturated carbon atom, and at least one ethylenically unsaturated compound is comprised of a fluoroalcohol functional group having the structure:

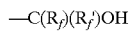

wherein $R_f$ and $R_f'$ are the same or different fluoroalkyl groups of from 1 to 10 carbon atoms or taken together are $(CF_2)_n$ wherein n is 2 to 10.

23. The copolymer of claim 22 further comprising a repeat unit derived from at least one ethylenically unsaturated compound containing a functional group having the structure

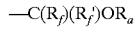

wherein $R_f$ and $R_f'$ are the same or different fluoroalkyl groups of from 1 to 10 carbon atoms or taken together are $(CF_2)_n$ wherein n is 2 to 10 and $R_a$ is an acid- or base-labile protecting group.

24. The copolymer of claim 23, wherein $R_a$ is $CH_2OCH_2R_5$, and $R_5$ is hydrogen or a linear or branched alkyl group of between 1 and 10 carbon atoms.

25. The copolymer of claim 22 wherein the ethylenically unsaturated compound containing at least one fluorine atom covalently attached to an ethylenically unsaturated carbon atom is selected from the group consisting of tetrafluoroethylene, chlorotrifluoroethylene, hexafluoropropylene, trifluoroethylene, and $R_fOCF=CF_2$ wherein $R_f$ is a saturated fluoroalkyl group of from 1 to 10 carbon atoms.

26. The fluorine-containing polymer of claim 22 wherein $R_f$ and $R_f'$ are $CF_3$.

27. A photoresist comprising:
(a) a fluorine-containing copolymer comprising a repeat unit derived from at least one ethylenically unsaturated compound characterized in that at least one ethylenically unsaturated compound is cyclic or polycyclic, at least one ethylenically unsaturated compound contains at least one fluorine atom covalently attached to an ethylenically unsaturated carbon atom, and at least one ethylenically unsaturated compound is comprised of a fluoroalcohol functional group having the structure:

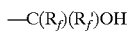
—C($R_f$)($R_f'$)OH wherein $R_f$ and $R_f'$ are the same or different fluoroalkyl groups of from 1 to 10 carbon atoms or taken together are $(CF_2)_n$ wherein n is 2 to 10; and
(b) at least one photoactive component;
wherein the fluorine-containing copolymer contains sufficient functionality to render the photoresist developable so as to produce a relief image upon imagewise exposure to ultraviolet radiation having wavelength of <365 nm.

28. The photoresist of claim 27, further comprising a dissolution inhibitor.

29. The photoresist of claim 27, wherein the fluorine-containing copolymer further comprises a repeat unit derived from at least one ethylenically unsaturated compound containing a functional group having the structure

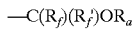
—C($R_f$)($R_f'$)$OR_a$ wherein $R_f$ and $R_f'$ are the same or different fluoroalkyl groups of from 1 to 10 carbon atoms or taken together are $(CF_2)_n$ wherein n is 2 to 10 and $R_a$ is an acid- or base-labile protecting group.

30. The photoresist of claim 29, wherein $R_a$ is $CH_2OCH_2R_5$, and $R_5$ is hydrogen or a linear or branched alkyl group of between 1 and 10 carbon atoms.

31. A process for preparing a photoresist image on a substrate comprising, in order:
(W) applying a photoresist composition on a substrate, wherein the photoresist comprises:
(a) a fluorine-containing copolymer comprising a repeat unit derived from at least one ethylenically unsaturated compound characterized in that at least one ethylenically unsaturated compound is cyclic or polycyclic, at least one ethylenically unsaturated compound contains at least one fluorine atom covalently attached to an ethylenically unsaturated carbon atom, and at least one ethylenically unsaturated compound is comprised of a fluoroalcohol functional group having the structure:

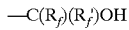
—C($R_f$)($R_f'$)OH wherein $R_f$ and $R_f'$ are the same or different fluoroalkyl groups of from 1 to 10 carbon atoms or taken together are $(CF_2)_n$ wherein n is 2 to 10;
(b) at least one photoactive component; and
(c) a solvent;
wherein the fluorine-containing copolymer contains sufficient functionality to render the photoresist developable so as to produce a relief image upon imagewise exposure to ultraviolet radiation having wavelength of <365 nm;
(X) drying the photoresist composition to substantially remove the solvent and thereby form a photoresist layer on the substrate;
(Y) imagewise exposing the photoresist layer to form imaged and non-imaged areas; and
(Z) developing the exposed photoresist layer having imaged and non-imaged areas to form the relief image on the substrate.

32. The process of claim 31 wherein the imagewise exposure is performed using ultraviolet radiation having a wavelength of 157 nm.

33. The process of claim 31 wherein the imagewise exposure is performed using ultraviolet radiation, having a wavelength of 193 nm.

34. The process of claim 31 wherein the photoresist composition in light exposed areas is rendered soluble in aqueous base developer upon exposure to patterned ultraviolet radiation of wavelength less than or equal to 365 nm.

35. The process of claim 31, wherein the fluorine-containing copolymer further comprises a repeat unit derived from at least one ethylenically unsaturated compound containing a functional group having the structure

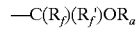
—C($R_f$)($R_f'$)$OR_a$ wherein $R_f$ and $R_f'$ are the same or different fluoroalkyl groups of from 1 to 10 carbon atoms or taken together are $(CF_2)_n$ wherein n is 2 to 10 and $R_a$ is an acid- or base-labile protecting group.

36. The process of claim 35 wherein $R_a$ is $CH_2OCH_2R_5$, and $R_5$ is hydrogen or a linear or branched alkyl group of between 1 and 10 carbon atoms.

37. The process of claim 31 wherein the functionality of the fluorine-containing polymer is selected from the group consisting of a fluoroalcohol, a carboxylic acid and a protected acid group.

38. A photoresist comprising:
(a) a fluorine-containing copolymer comprising a repeat unit derived from at least one ethylenically unsaturated compound containing at least three fluorine atoms covalently attached to two ethylenically unsaturated carbon atoms and a repeat unit derived from at least one ethylenically unsaturated compound containing a fluoroalcohol functional group having the structure:

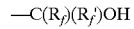
—C($R_f$)($R_f'$)OH wherein $R_f$ and $R_f'$ are the same or different fluoroalkyl groups of from 1 to 10 carbon atoms or taken together are $(CF_2)_n$ wherein n is 2 to 10; and
(b) at least one photoactive component;
wherein the fluorine-containing copolymer contains sufficient functionality to render the photoresist developable so as to produce a relief image upon imagewise exposure to ultraviolet radiation having wavelength of <365 nm.

39. The photoresist of claim 38, further comprising a dissolution inhibitor.

40. The photoresist of claim 38, wherein the fluorine-containing copolymer further comprises a repeat unit derived from at least one ethylenically unsaturated compound containing a functional group having the structure

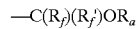
—C($R_f$)($R_f'$)$OR_a$ wherein $R_f$ and $R_f'$ are the same or different fluoroalkyl groups of from 1 to 10 carbon atoms or taken together are $(CF_2)_n$ wherein n is 2 to 10 and $R_a$ is an acid- or base-labile protecting group.

41. The photoresist of claim 40, wherein $R_a$ is $CH_2OCH_2R_5$, and $R_5$ is hydrogen or a linear or branched alkyl group of between 1 and 10 carbon atoms.

42. A process for preparing a photoresist image on a substrate comprising, in order:
(W) applying a photoresist composition on a substrate, wherein the photoresist composition comprises:
(a) a fluorine-containing copolymer comprising a repeat unit derived from at least one ethylenically unsaturated compound containing at least three fluorine atoms covalently attached to two ethylenically unsaturated carbon atoms and a repeat unit derived from at least one ethylenically unsaturated compound containing a fluoroalcohol functional group having the structure:

—C(R$_f$)(R$_f'$)OH wherein R$_f$ and R$_f'$ are the same or different fluoroalkyl groups of from 1 to 10 carbon atoms or taken together are (CF$_2$)$_n$ wherein n is 2 to 10; and
(b) at least one photoactive component; and
(c) a solvent;
(X) drying the photoresist composition to substantially remove the solvent and thereby form a photoresist layer on the substrate;
(Y) imagewise exposing the photoresist layer to form imaged and non-imaged areas; and
(Z) developing the exposed photoresist layer having imaged and non-imaged areas to form the relief image on the substrate.

43. The process of claim 42 wherein the imagewise exposure is performed using ultraviolet radiation having a wavelength of 157 nm.

44. The process of claim 42 wherein the imagewise exposure is performed using ultraviolet radiation, having a wavelength of 193 nm.

45. The process of claim 42 wherein the photoresist composition in light exposed areas is rendered soluble in aqueous base developer upon exposure to patterned ultraviolet radiation of wavelength less than or equal to 365 nm.

46. The process of claim 42, wherein the fluorine-containing copolymer further comprises a repeat unit derived from at least one ethylenically unsaturated compound containing a functional group having the structure —C(R$_f$)(R$_f'$)OR$_a$ wherein R$_f$ and R$_f'$ are the same or different fluoroalkyl groups of from 1 to 10 carbon atoms or taken together are (CF$_2$)$_n$ wherein n is 2 to 10 and R$_a$ is an acid- or base-labile protecting group.

47. The process of claim 46 wherein R$_a$ is CH$_2$OCH$_2$R$_5$, and R$_5$ is hydrogen or a linear or branched alkyl group of between 1 and 10 carbon atoms.

48. A photoresist comprising:
(a) a fluorine-containing polymer comprising a repeat unit derived from at least one ethylenically unsaturated compound containing a fluoroalcohol functional group having the structure:

—XCH$_2$C(R$_f$)(R$_f'$)OH wherein R$_f$ and R$_f'$ are the same or different fluoroalkyl groups of from 1 to 10 carbon atoms or taken together are (CF$_2$)$_n$ wherein n is 2 to 10; and X is selected from the group consisting of sulfur, oxygen, nitrogen, phosphorous, other Group Va element, and other Group VIa element; and
(b) at least one photoactive component;
wherein the fluorine-containing polymer contains sufficient functionality to render the photoresist developable so as to produce a relief image upon imagewise exposure to ultraviolet radiation having wavelength of <365 nm.

49. The photoresist of claim 48, further comprising a dissolution inhibitor.

50. The photoresist of claim 48, wherein the fluorine-containing polymer further comprises a repeat unit derived from at least one ethylenically unsaturated compound containing a functional group having the structure —XCH$_2$C(R$_f$)(R$_f'$)OR$_a$ wherein R$_f$ and R$_f'$ are the same or different fluoroalkyl groups of from 1 to 10 carbon atoms or taken together are (CF$_2$)$_n$ wherein n is 2 to 10, R$_a$ is an acid- or base-labile protecting group and X is selected from the group consisting of sulfur, oxygen, nitrogen, phosphorous, other Group Va element, and other Group VIa element.

51. The photoresist of claim 50, wherein R$_a$ is CH$_2$OCH$_2$R$_5$, and R$_5$ is hydrogen or linear or branched alkyl group of between 1 and 10 carbon atoms.

52. The photoresist of claim 48, wherein the fluorine-containing polymer has an absorption coefficient of less than 3.0 $\mu$m$^{-1}$ at a wavelength of 157 nm.

53. A process for preparing a photoresist image on a substrate comprising, in order:
(W) applying a photoresist composition on a substrate, wherein the photoresist composition comprises:
(a) a fluorine-containing polymer comprising a repeat unit derived from at least one ethylenically unsaturated compound containing a fluoroalcohol functional group having the structure:

—XCH$_2$C(R$_f$)(R$_f'$)OH wherein R$_f$ and R$_f'$ are the same or different fluoroalkyl groups of from 1 to 10 carbon atoms or taken together are (CF$_2$)$_n$ wherein n is 2 to 10; and X is selected from the group consisting of sulfur, oxygen, nitrogen, phosphorous, other Group Va element, and other Group VIa element; and
(b) at least one photoactive component;
wherein the fluorine-containing polymer contains sufficient functionality to render the photoresist developable so as to produce a relief image upon imagewise exposure to ultraviolet radiation having wavelength <365 nm;
(c) at least one photoactive component; and
(d) a solvent;
(X) drying the photoresist composition to substantially remove the solvent and thereby form a photoresist layer on the substrate;
(Y) imagewise exposing the photoresist layer to form imaged and non-imaged areas; and
(Z) developing the exposed photoresist layer having imaged and non-imaged areas to form the relief image on the substrate.

54. The process of claim 53 wherein the imagewise exposure is performed using ultraviolet radiation having a wavelength of 157 nm.

55. The process of claim 53 wherein the imagewise exposure is performed using ultraviolet radiation having a wavelength of 193 nm.

56. The process of claim 53 wherein the photoresist composition in light exposed areas is rendered soluble in aqueous base developer upon exposure to patterned ultraviolet radiation of wavelength less than or equal to 365 nm.

57. The process of claim 53, wherein the fluorine-containing polymer further comprises a repeat unit derived from at least one ethylenically unsaturated compound containing a functional group having the structure

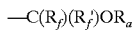

wherein $R_f$ and $R_f'$ are the same or different fluoroalkyl groups of from 1 to 10 carbon atoms or taken together are $(CF_2)_n$ wherein n is 2 to 10 and $R_a$ is an acid- or base-labile protecting group.

58. The process of claim 57 wherein $R_a$ is $CH_2OCH_2R_5$, and $R_5$ is hydrogen or a linear or branched alkyl group of between 1 and 10 carbon atoms.

59. A fluorine-containing polymer comprising the structure:

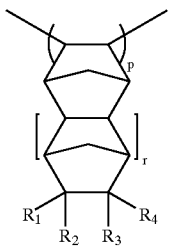

wherein each of $R_1$, $R_2$, $R_3$, and $R_4$ independently is hydrogen, a halogen atom, a hydrocarbon group containing from 1 to 10 carbon atoms, a substituted hydrocarbon group, an alkoxy group, a carboxylic acid, a carboxylic acid ester, or a functional group containing the structure:

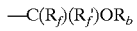

wherein $R_f$ and $R_f'$ are the same or different fluoroalkyl groups of from 1 to 10 carbon atoms or taken together are $(CF_2)_n$ wherein n is 2 to 10; $R_b$ is hydrogen or an acid- or base-labile protecting group; p is the number of repeat units in the polymer; r is 0–4; at least one of the repeat units has a structure whereby at least one of $R_1$, $R_2$, $R_3$, and $R_4$ contains the structure $C(R_f)(R_f')OR_b$; and wherein the fluorine-containing polymer has an absorption coefficient of less than 4.0 $\mu m^{-1}$ at a wavelength of 157 nm.

60. The fluorine-containing polymer of claim 59, wherein $R_b$ is $CH_2OCH_2R_5$, and $R_5$ is hydrogen or a linear or branched alkyl group of between 1 and 10 carbon atoms.

61. A photoresist comprising:
   (a) a fluorine-containing polymer comprising the structure:

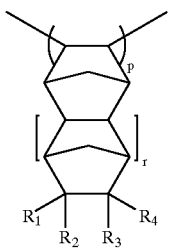

wherein each of $R_1$, $R_2$, $R_3$, and $R_4$ independently is hydrogen, a halogen atom, a hydrocarbon group containing from 1 to 10 carbon atoms, a substituted hydrocarbon group, an alkoxy group, a carboxylic acid, a carboxylic acid ester, or a functional group containing the structure:

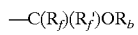

wherein $R_f$ and $R_f'$ are the same or different fluoroalkyl groups of from 1 to 10 carbon atoms or taken together are $(CF_2)_n$ wherein n is 2 to 10; $R_b$ is hydrogen or an acid- or base-labile protecting group; p is the number of repeat units in the polymer; r is 0–4; at least one of the repeating units has a structure whereby at least one of $R_1$, $R_2$, $R_3$, and $R_4$ contains the structure $C(R_f)(R_f')OR_b$; and wherein the fluorine-containing polymer has an absorption coefficient of less than 4.0 $\mu m^{-1}$ at a wavelength of 157 nm; and
   (b) at least one photoactive component.

62. The photoresist of claim 61 further comprising a dissolution inhibitor.

63. A process for preparing a photoresist image on a substrate comprising, in order:
   (W) applying a photoresist composition on a substrate, wherein photoresist composition comprises:
      (a) a fluorine-containing polymer comprising the structure:

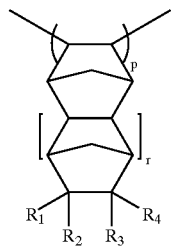

wherein each of $R_1$, $R_2$, $R_3$, and $R_4$ independently is hydrogen, a halogen atom, a hydrocarbon group containing from 1 to 10 carbon atoms, a substituted hydrocarbon group, an alkoxy group, a carboxylic acid, a carboxylic acid ester, or functional group containing the structure:

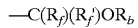

wherein $R_f$ and $R_f'$ are the same or different fluoroalkyl groups of from 1 to 10 carbon atoms or taken together are $(CF_2)_n$ wherein n is 2 to 10; $R_b$ is hydrogen or an acid- or base-labile protecting group; p is the number of repeat units in the polymer; r is 0–4; at least one of the repeat units has a structure whereby at least one of $R_1$, $R_2$, $R_3$, and $R_4$ contains the structure $C(R_f)(R_f')OR_b$; and wherein the fluorine-containing polymer has an absorption coefficient of less than 4.0 $\mu m^{-1}$ at a wavelength of 157 nm;
      (b) at least one photoactive component; and
      (c) a solvent;
   (X) drying the photoresist composition to substantially remove the solvent and thereby form a photoresist layer on the substrate;
   (Y) imagewise exposing the photoresist layer to form imaged and non-imaged areas; and
   (Z) developing the exposed photoresist layer having imaged and non-imaged areas to form the relief image on the substrate.

64. The process of claim 63 wherein the imagewise exposure is performed using ultraviolet radiation having a wavelength of 157 nm.

65. The process of claim 63 wherein the imagewise exposure is performed using ultraviolet radiation, having a wavelength of 193 nm.

66. The process of claim 63 wherein the photoresist composition in light exposed areas is rendered soluble in aqueous base developer upon exposure to patterned ultraviolet radiation of wavelength less than or equal to 365 nm.

* * * * *

UNITED STATES PATENT AND TRADEMARK OFFICE
CERTIFICATE OF CORRECTION

PATENT NO. : 6,790,587 B1
DATED : September 14, 2004
INVENTOR(S) : Feiring Andrew Edward, Feldman Jerald and Schadt, III Frank Leonard It is certified that error appears in the above-identified patent and that said Letters Patent is hereby corrected as shown below:

Column 43,
Line 21, "The process of claim 1 which is a positive working" should read -- The photoresist of claim 1 which is a positive working --.

Column 44,
Line 9, "wherein $R_f$ and $F_f'$ are the same or different fluoroalkyl" should read -- wherein $R_f$ and $R_f'$ are the same or different fluoroalkyl --.
Line 28, "The process of claim 11 wherein $R_f$ wherein $R_f'$" should read -- The process of claim 11 wherein $R_f$ and $R_f'$ --.

Column 46,
Line 10, "exposure is performed using ultraviolet radiation,having a" should read -- exposure is performed using ultraviolet radiation, having a --.

Signed and Sealed this

Twenty-second Day of November, 2005

JON W. DUDAS
*Director of the United States Patent and Trademark Office*